(12) United States Patent
Okada et al.

(10) Patent No.: US 10,197,874 B2
(45) Date of Patent: Feb. 5, 2019

(54) LIQUID CRYSTAL DISPLAY DEVICE

(71) Applicant: Sharp Kabushiki Kaisha, Sakai, Osaka (JP)

(72) Inventors: Kuniaki Okada, Sakai (JP); Seiichi Uchida, Sakai (JP)

(73) Assignee: Sharp Kabushiki Kaisha, Sakai (JP)

(*) Notice: Subject to any disclaimer, the term of this patent is extended or adjusted under 35 U.S.C. 154(b) by 0 days.

(21) Appl. No.: 15/572,539

(22) PCT Filed: Jun. 24, 2016

(86) PCT No.: PCT/JP2016/068815
§ 371 (c)(1),
(2) Date: Nov. 8, 2017

(87) PCT Pub. No.: WO2017/002724
PCT Pub. Date: Jan. 5, 2017

(65) Prior Publication Data
US 2018/0120656 A1    May 3, 2018

(30) Foreign Application Priority Data
Jun. 30, 2015  (JP) .................. 2015-130983

(51) Int. Cl.
G02F 1/136    (2006.01)
G02F 1/1362   (2006.01)
(Continued)

(52) U.S. Cl.
CPC ...... *G02F 1/136209* (2013.01); *G02F 1/1335* (2013.01); *G02F 1/1339* (2013.01);
(Continued)

(58) Field of Classification Search
None
See application file for complete search history.

(56) References Cited

U.S. PATENT DOCUMENTS

| 2008/0186435 A1* | 8/2008 | Son | G02F 1/133514 349/106 |
| 2009/0134390 A1* | 5/2009 | Kodama | H01L 27/1214 257/43 |

(Continued)

FOREIGN PATENT DOCUMENTS

| JP | 2007-199116 A | 8/2007 |
| JP | 2010-072067 A | 4/2010 |

(Continued)

OTHER PUBLICATIONS

Official Communication issued in International Patent Application No. PCT/JP2016/068815, dated Sep. 20, 2016.

*Primary Examiner* — James A Dudek
(74) *Attorney, Agent, or Firm* — Keating & Bennett, LLP

(57) ABSTRACT

A first substrate (10) of a liquid crystal display device (100) includes a TFT (2) that includes an oxide semiconductor layer (2a). A second substrate (20) includes a color filter layer (22) and a light-shielding layer (21). The light-shielding layer has a first TFT light-shielding portion (21$t$1) for each row in at least a blue pixel column, and a second TFT light-shielding portion (21$t$2) every n rows (n represents an integer of 2 or more) in a pixel column in which at least one type of color filter other than blue color filters is provided, the second TFT light-shielding portion having a larger area than the first TFT light-shielding portion. A columnar spacer (40) is arranged so as not to overlap the first TFT light-shielding portion but to overlap the second TFT light-shielding portion.

16 Claims, 14 Drawing Sheets

(51) Int. Cl.
*G02F 1/1335* (2006.01)
*G02F 1/1339* (2006.01)
*G02F 1/1343* (2006.01)
*G02F 1/1368* (2006.01)
*H01L 29/786* (2006.01)
*H01L 27/12* (2006.01)
*H01L 29/24* (2006.01)
*H01L 29/66* (2006.01)

(52) U.S. Cl.
CPC .......... *G02F 1/1343* (2013.01); *G02F 1/1368* (2013.01); *G02F 1/13394* (2013.01); *G02F 1/133512* (2013.01); *G02F 1/133514* (2013.01); *H01L 27/1225* (2013.01); *H01L 27/1262* (2013.01); *H01L 29/24* (2013.01); *H01L 29/66969* (2013.01); *H01L 29/786* (2013.01); *H01L 29/7869* (2013.01); *H01L 29/78633* (2013.01); *G02F 2001/136222* (2013.01); *G02F 2202/10* (2013.01); *H01L 27/1255* (2013.01)

(56) References Cited

U.S. PATENT DOCUMENTS

| | | |
|---|---|---|
| 2011/0042668 A1 | 2/2011 | Hama et al. |
| 2012/0138922 A1 | 6/2012 | Yamazaki et al. |
| 2013/0320334 A1 | 12/2013 | Yamazaki et al. |
| 2016/0187717 A1* | 6/2016 | Hosokawa ........ G02F 1/133512 349/110 |

FOREIGN PATENT DOCUMENTS

| | | |
|---|---|---|
| JP | 2011-066375 A | 3/2011 |
| JP | 2012-083627 A | 4/2012 |
| JP | 2012-134475 A | 7/2012 |
| JP | 2013-080148 A | 5/2013 |
| JP | 2014-007399 A | 1/2014 |
| JP | 2014-229710 A | 12/2014 |

* cited by examiner

LIQUID CRYSTAL DISPLAY DEVICE

TECHNICAL FIELD

The present invention relates to liquid crystal display devices and in particular to a liquid crystal display device equipped with oxide semiconductors TFT.

BACKGROUND ART

An active matrix substrate used in liquid crystal display devices and the like is equipped with a switching element, such as a thin film transistor (hereinafter "TFT"), provided for each pixel. A TFT that uses an oxide semiconductor layer as an active layer (hereinafter referred to as an "oxide semiconductor TFT") is known as this switching element. PTL 1 discloses a liquid crystal display device that uses InGaZnO (an oxide constituted by indium, gallium, and zinc) in the active layer of the TFT.

Oxide semiconductor TFTs can operate at a higher speed than amorphous silicon TFTs. Furthermore, since oxide semiconductor films are formed by a simpler process than polycrystal silicon films, oxide semiconductor films are applicable to devices required to have a large area. Thus, the oxide semiconductor TFTs are expected to be high-performance active elements that can be manufactured with fewer manufacturing steps and less manufacturing costs.

In addition, since the mobility in the oxide semiconductor is high, performance comparable or superior to amorphous silicon TFTs of related art can be obtained even when the size is reduced. Thus, if an active matrix substrate of a liquid crystal display device is manufactured by using oxide semiconductor TFTs, the ratio of the area of a pixel occupied by a TFT can be decreased, and the pixel aperture ratio can be improved. Thus, bright display is possible at a suppressed quantity of backlight, and low power consumption can be realized.

Furthermore, since the oxide semiconductor TFTs have excellent off-leak characteristics, an operation mode with which display is performed at a low image rewriting frequency can also be used. For example, in displaying a still image, operation can be performed so that the image data is rewritten once every second. Such a driving method is called pause drive, low-frequency drive, etc., and can significantly reduce the power consumption of the liquid crystal display device.

CITATION LIST

Patent Literature

PTL 1: Japanese Unexamined Patent Application Publication No. 2012-134475
PTL 2: Japanese Unexamined Patent Application Publication No. 2011-66375

SUMMARY OF INVENTION

Technical Problem

As described above, using oxide semiconductor TFTs can improve the aperture ratio compared to when amorphous silicon TFTs are used; however, recent years have seen further advancement in the resolution of liquid crystal display devices, and further improvements in aperture ratio are desirable.

However, further improvements in the aperture ratio of liquid crystal display devices equipped with oxide semiconductor TFTs face challenges due to the following reasons.

TFT characteristics of oxide semiconductor TFTs are deteriorated due to irradiation with light (refer to PTL 2). Specifically, the threshold voltage undergoes a minus shift. Thus, in liquid crystal display devices equipped with oxide semiconductor TFTs, a black matrix (light-shielding layer) disposed on the counter substrate (disposed to oppose an active matrix substrate) side includes regions that overlap the oxide semiconductor TFTs, and these regions (TFT light-shielding portions) shield the oxide semiconductor TFTs from light. These TFT light-shielding portions obstruct further improvements in aperture ratio.

The present invention has been made to address the issues described above and aims to improve the aperture ratio of a liquid crystal display device equipped with oxide semiconductor TFTs.

Solution to Problem

A liquid crystal display device according to an embodiment of the present invention includes a first substrate, a second substrate disposed to oppose the first substrate, and a liquid crystal layer disposed between the first substrate and the second substrate, and a plurality of pixels arranged into a matrix having a plurality of rows and a plurality of columns. The display device further comprises a plurality of columnar spacers that are disposed between the first substrate and the second substrate and define a thickness of the liquid crystal layer; the plurality of pixels include red pixels that display red, green pixels that display green, and blue pixels that display blue; an arrangement of the plurality of pixels is a stripe arrangement that includes a red pixel column, a green pixel column, and a blue pixel column; the first substrate includes a TFT that includes an oxide semiconductor layer including a channel region, a source region, and a drain region, each of the plurality of pixels being provided with one TFT; the first substrate or the second substrate includes a color filter layer and a light-shielding layer; the color filter layer includes a plurality of types of color filters that include a red color filter disposed in the red pixel column, a green color filter disposed in the green pixel column, and a blue color filter disposed in the blue pixel column; the light-shielding layer includes a first TFT light-shielding portion that shields at least the channel region of the TFT from light in at least the blue pixel column, one first TFT light-shielding portion being provided for each row; the light-shielding layer includes a second TFT light-shielding portion that shields at least the channel region of the TFT from light in a pixel column in which at least one type of color filter other than the blue color filter selected from among the plurality of types of color filters is provided, the second TFT light-shielding portion having a larger area than the first TFT light-shielding portion and being provided every n rows (n represents an integer of 2 or more); and the plurality of columnar spacers are arranged so that each does not overlap the first TFT light-shielding portion but does overlap the second TFT light-shielding portion.

In a certain embodiment, the at least one type of color filter is one type of color filter selected from among the plurality of types of color filters, and the plurality of columnar spacers are arranged so that each overlaps the second TFT light-shielding portion in the pixel column in which the one type of color filter is provided.

In a certain embodiment, the one type of color filter is the red color filter, and the plurality of columnar spacers are arranged so that each overlaps the second TFT light-shielding portion in the red pixel column.

In a certain embodiment, the one type of color filter is the green color filter, and the plurality of columnar spacers are arranged so that each overlaps the second TFT light-shielding portion in the green pixel column.

In a certain embodiment, the at least one type of color filter includes two types of color filters selected from among the plurality of types of color filters.

In a certain embodiment, the second TFT light-shielding portion in a pixel column in which one type of color filter selected from the two types of color filters is provided, and the second TFT light-shielding portion in a pixel column in which the other type of color filter is provided are provided continuously so as to define a light-shielding region that extends two pixels in a row direction, and the plurality of columnar spacers are arranged so that one columnar spacer is provided for each light-shielding region.

In a certain embodiment, the two types of color filters are the red color filter and the green color filter, and the plurality of columnar spacers are arranged so that one columnar spacer is provided for each light-shielding region defined by the second TFT light-shielding portion in the red pixel column and the second TFT light-shielding portion in the green pixel column.

In a certain embodiment, the second TFT light-shielding portion in a pixel column in which one type of color filter selected from the two types of color filters is provided, and the second TFT light-shielding portion in a pixel column in which the other type of color filter is provided are not continuous in the row direction, and the plurality of columnar spacers include a columnar spacer that is arranged to overlap the second TFT light-shielding portion in the pixel column in which the one type of color filter is provided, and a columnar spacer that is arranged to overlap the second TFT light-shielding portion in the pixel column in which the other type of color filter is provided.

In a certain embodiment, the two types of color filters are the red color filter and the green color filter, and the plurality of columnar spacers include a columnar spacer that is arranged to overlap the second TFT light-shielding portion in the red pixel column, and a columnar spacer that is arranged to overlap the second TFT light-shielding portion in the green pixel column.

In a certain embodiment, the plurality of pixels further include yellow pixels that display yellow; an arrangement of the plurality of pixels is a stripe arrangement that includes, in addition to the red pixel column, the green pixel column, and the blue pixel column, a yellow pixel column; and the plurality of types of color filters further include a yellow color filter disposed in the yellow pixel column.

In a certain embodiment, the at least one type of color filter has an average transmittance of 0.2% or less for visible light having a wavelength of 450 nm or less.

In a certain embodiment, n=2.

In a certain embodiment, the plurality of pixels have aperture ratios substantially the same as each other.

In a certain embodiment, the second substrate includes the color filter layer and the light-shielding layer.

In a certain embodiment, the oxide semiconductor layer contains an In—Ga—Zn—O-based semiconductor.

In a certain embodiment, the In—Ga—Zn—O-based semiconductor contains a crystalline portion.

Advantageous Effects of Invention

According to the embodiments of the present invention, the aperture ratio of the liquid crystal display device equipped with oxide semiconductor TFTs can be improved while suppressing occurrence of chromaticity deviation.

DESCRIPTION OF EMBODIMENTS

The inventors of the present application have proposed a technique for improving the aperture ratio of a liquid crystal display device equipped with oxide semiconductor TFTs in International Application PCT/JP2015/084786. According to the investigations conducted by the inventors of the present application, it has been found that although the aperture ratio is improved by simply applying the technique proposed in International Application PCT/JP2015/084786, the chromaticity of white deviates from the original chromaticity (hereinafter this is referred to as the "chromaticity deviation") in some cases. In contrast, according to the embodiments of the present invention, the aperture ratio of the liquid crystal display device equipped with oxide semiconductor TFTs can be improved while suppressing occurrence of chromaticity deviation.

The embodiments of the present invention will now be described with reference to the drawings. It should be understood that the present invention is not limited by the embodiments described below.

(Embodiment 1)

Figure 1:
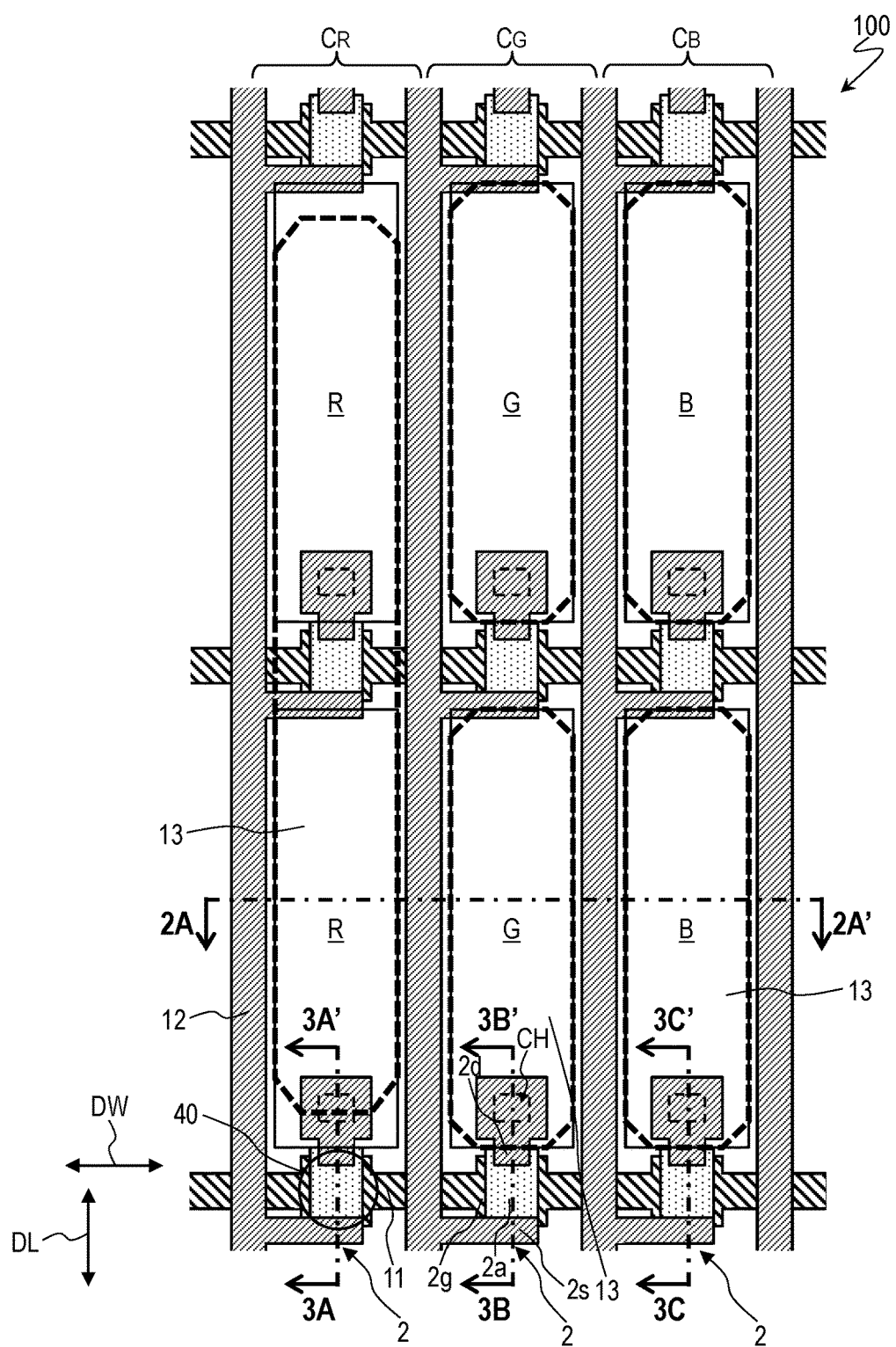
FIG. 1 is a schematic plan view of a liquid crystal display device 100 according to one embodiment of the present invention.
Figure 2:
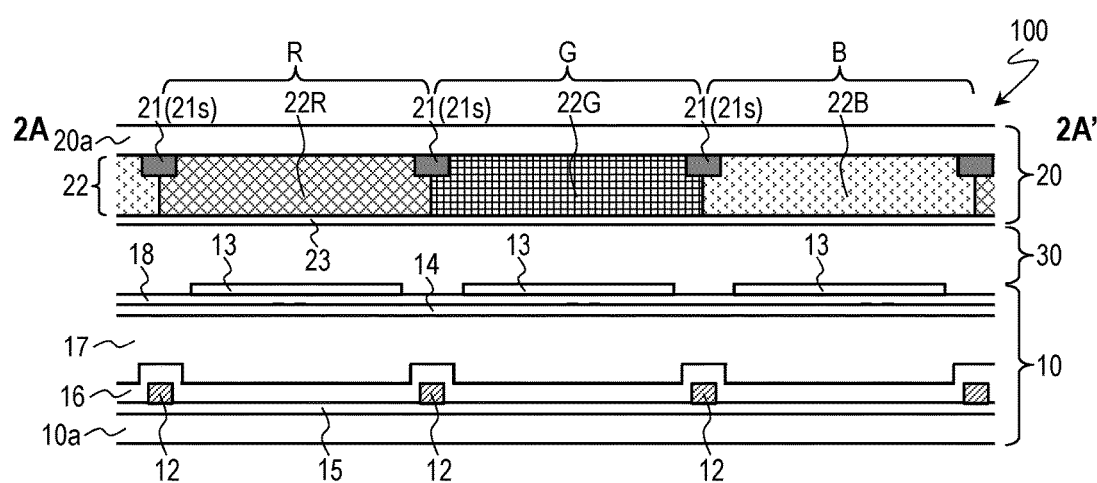
FIG. 2 is a schematic cross-sectional view of the liquid crystal display device 100 taken along line 2A-2A' in FIG. 1.
Figure 3:
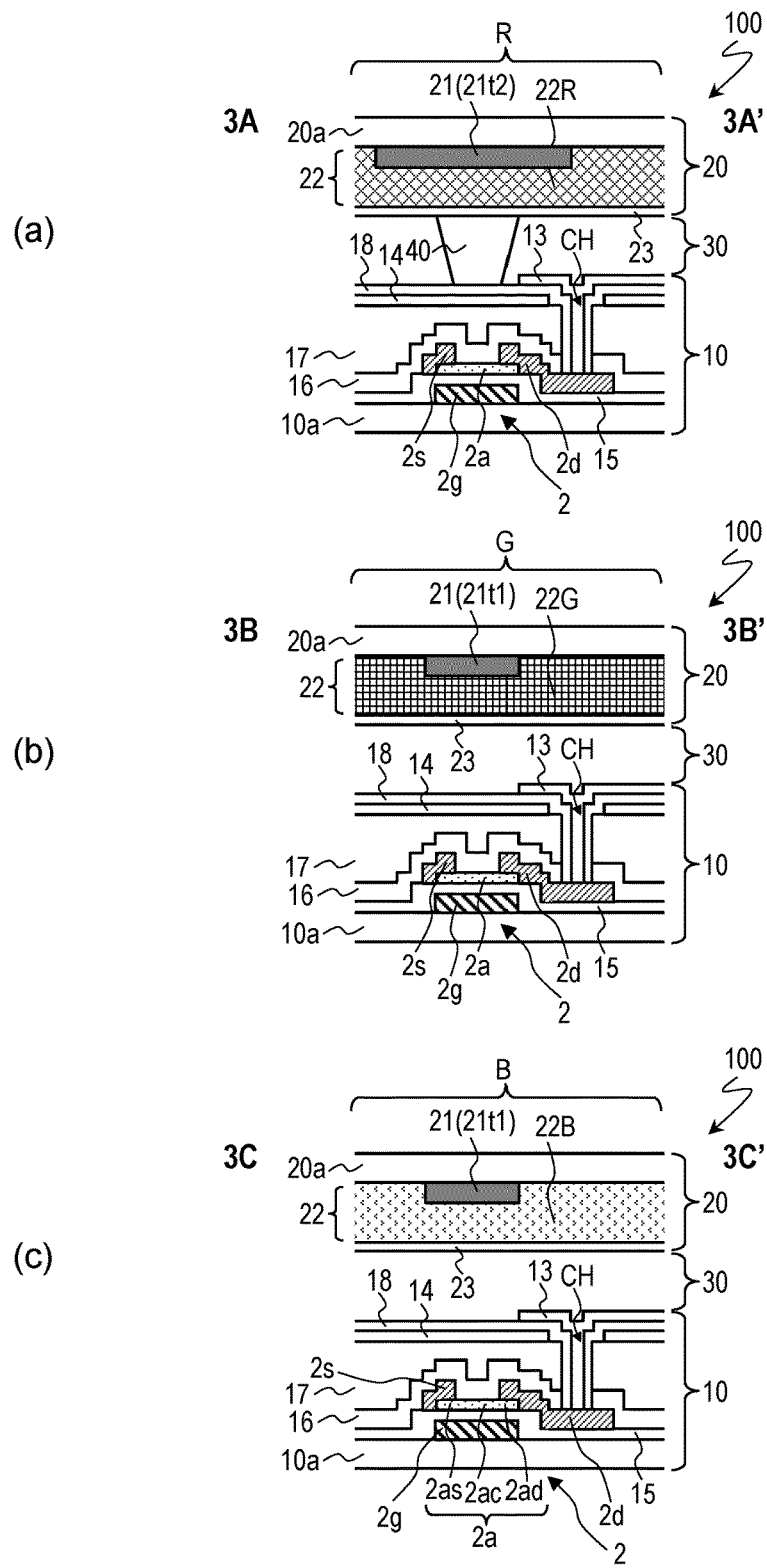
FIGS. 3(a), (b), and (c) are respectively schematic cross-sectional views of the liquid crystal display device 100 taken along line 3A-3A', 3B-3B', and 3C-3C' in FIG. 1.

FIGS. 1 to 3 illustrate a liquid crystal display device 100 according to this embodiment. FIG. 1 is a schematic plan view of the liquid crystal display device 100. FIG. 2 is a cross-sectional view taken along line 2A-2A' in FIG. 1. FIGS. 3(a), (b), and (c) are, respectively, cross-sectional views taken along lines 3A-3A', 3B-3B', and 3C-3C' in FIG. 1.

As illustrated in FIG. 2, the liquid crystal display device 100 includes a TFT substrate (first substrate) 10, a counter substrate (second substrate) 20 disposed to oppose the TFT substrate 10, and a liquid crystal layer 30 disposed between the TFT substrate 10 and the counter substrate 20. As illustrated in FIG. 3(a), the liquid crystal display device 100 further includes multiple columnar spacers 40 that are disposed between the TFT substrate 10 and the counter substrate 20 to define the thickness of the liquid crystal layer 30.

The liquid crystal display device 100 also has multiple pixels arranged into a matrix having multiple rows and multiple columns. In this embodiment, the pixels of the liquid crystal display device 100 include red pixels R that display red, green pixels G that display green, and blue pixels B that display blue. Three pixels (a red pixel R, a green pixel G, and a blue pixel B) that display colors different from one another constitute one color display pixel. As illustrated in FIG. 1, the arrangement of the pixels is, a stripe arrangement that includes a red pixel column $C_R$, a green pixel column $C_G$, and a blue pixel column $C_B$. The red pixel column $C_R$ is constituted by as many red pixels R as the number of rows. Similarly, the green pixel column $C_G$ is constituted by as many green pixels G as the number of rows, and the blue pixel column $C_B$ is constituted by as many blue pixels B as the number of rows.

As illustrated in FIG. 1, the TFT substrate 10 includes one TFT (thin film transistor) 2 for each pixel, scanning lines (gate bus lines) 11 that extend in the row direction, and signal lines (source bus lines) 12 that extend in the column direction. The TFT substrate 10 also includes pixel electrodes 13 one for each pixel, and an auxiliary capacitor counter electrode 14 opposing the pixel electrodes 13.

As illustrated in FIGS. 3(a), (b), and (c), the TFT 2 includes an oxide semiconductor layer 2a, a gate electrode 2g, a source electrode 2s, and a drain electrode 2d. The gate electrode 2g is electrically connected to the scanning line 11, and a scan signal voltage is supplied from the scanning line 11 to the gate electrode 2g. In this embodiment, a portion of the scanning line 11 is formed to be wider than other portions, and this portion serves as the gate electrode 2g. The source electrode 2s is electrically connected to the signal line 12, and a display signal voltage is supplied from the signal line 12 to the source electrode 2s. In this embodiment, the source electrode 2s extends from the signal line 12. The drain electrode 2d is electrically connected to the pixel electrode 13.

In the oxide semiconductor layer 2a, a region 2as in contact with the source electrode 2s is called a "source region", and a region 2ad in contact with the drain electrode 2d is called a "drain region" (refer to FIG. 3(c)). In the oxide semiconductor layer 2a, a region 2ac that overlaps the gate electrode 2g and is positioned between the source region 2as and the drain region 2ad is called a "channel region" (refer to FIG. 3(c)). As such, the oxide semiconductor layer 2a includes the channel region 2ac, the source region 2as, and the drain region 2ad. In this description, a direction DL parallel to the direction in which an electric current flows in the channel region 2ac in a plane parallel to the substrate surface is referred to as a "channel length direction", and a direction DW orthogonal to the channel length direction is referred to as a "channel width direction". In this embodiment, the channel length direction DL is parallel to the column direction (in other words, the channel width direction DW is parallel to the row direction), and the source region 2as, the channel region 2ac, and the drain region 2ad are lined along the column direction. In this description, such an arrangement of the TFTs 2 is referred to as a "portrait arrangement".

The constitutional parts of the TFT substrate 10 described above are supported by an insulating transparent substrate 10a. The gate electrode 2g and the scanning line 11 are disposed on a surface of the transparent substrate 10a on the liquid crystal layer 30 side, and a gate insulating layer 15 is disposed to cover the gate electrode 2g and the scanning line 11.

The oxide semiconductor layer 2a, the source electrode 2s, the drain electrode 2d, and the signal line 12 are disposed on the gate insulating layer 15. The source electrode 2s is formed to contact an upper surface of the source region 2as of the oxide semiconductor layer 2a, and the drain electrode 2d is formed to contact an upper surface of the drain region 2ad of the oxide semiconductor layer 2a.

An inorganic insulating layer 16 is disposed so as to cover the oxide semiconductor layer 2a, the source electrode 2s, the drain electrode 2d, and the signal line 12. An organic insulating layer 17 is disposed on the inorganic insulating layer 16.

An auxiliary capacitor counter electrode 14 is disposed on the organic insulating layer 17. A dielectric layer 18 is disposed so as to cover the auxiliary capacitor counter electrode 14. The pixel electrode 13 is disposed on the dielectric layer 18. The pixel electrode 13 is connected to the drain electrode 2d through a contact hole CH formed in the inorganic insulating layer 16, the organic insulating layer 17, and the dielectric layer 18. The pixel electrode 13, the auxiliary capacitor counter electrode 14, and the dielectric layer 18 disposed therebetween constitute an auxiliary capacitor.

The counter substrate 20 includes a light-shielding layer (black matrix) 21, a color filter layer 22, and a counter electrode 23.

The light-shielding layer 21 includes a portion 21s (refer to FIG. 2) that overlaps the signal line 12, and portions 21t1 and 21t2 that overlap at least the channel region 2ac of the TFT 2 (in other words, that shield at least the channel region 2ac from light). Whereas the former portion 21s extends in the column direction, the latter portions 21t1 and 21t2 extend in the row direction (in other words, the channel width direction DW). Hereinafter, the portions 21t1 and 21t2 that shield at least the channel region 2ac of the TFT 2 from light are referred to as the "TFT light-shielding portion". Note that in FIG. 1, the openings in the light-shielding layer 21 are indicated by dotted lines.

The color filter layer 22 includes two or more types of color filters that transmit light of colors different from one another. In this embodiment, the color filter layer 22 includes red color filters 22R, green color filters 22G, and blue color filters 22B. The red color filters 22R are disposed in a red pixel column $C_R$ and transmit red light. The green color filters 22G are disposed in a green pixel column $C_G$ and transmit green light. The blue color filters 22B are disposed in a blue pixel column $C_B$ and transmit blue light.

The counter electrode 23 is disposed to oppose the pixel electrodes 13. Typically, the counter electrode 23 is one continuous conductive film (in other words, a common electrode) provided throughout the pixels.

The constitutional parts of the TFT substrate 20 described above are supported by an insulating transparent substrate 20a.

A pair of alignment films (not illustrated) are formed on surfaces of the TFT substrate 10 and the counter substrate 20, the surfaces being on the liquid crystal layer 30 side. In this embodiment, since the display mode is a vertical alignment (VA) mode, the pair of alignment films are vertical alignment films.

The liquid crystal display device 100 is a transmissive liquid crystal display device in which display is performed in a transmissive mode, and further includes a backlight (illuminating device) not illustrated in the drawings.

In this embodiment, each of the blue color filters 22B and the green color filters 22G has an average transmittance greater than 0.2% for visible light having a wavelength of 450 nm or less. In contrast, the red color filters 22R have an average transmittance of 0.2% or less for visible light having a wavelength of 450 nm or less. In this description, a color filter having an average transmittance of 0.2% or less for visible light having a wavelength of 450 nm or less may be referred to as a "short-wavelength-light-absorbing color filter".

Figure 4:
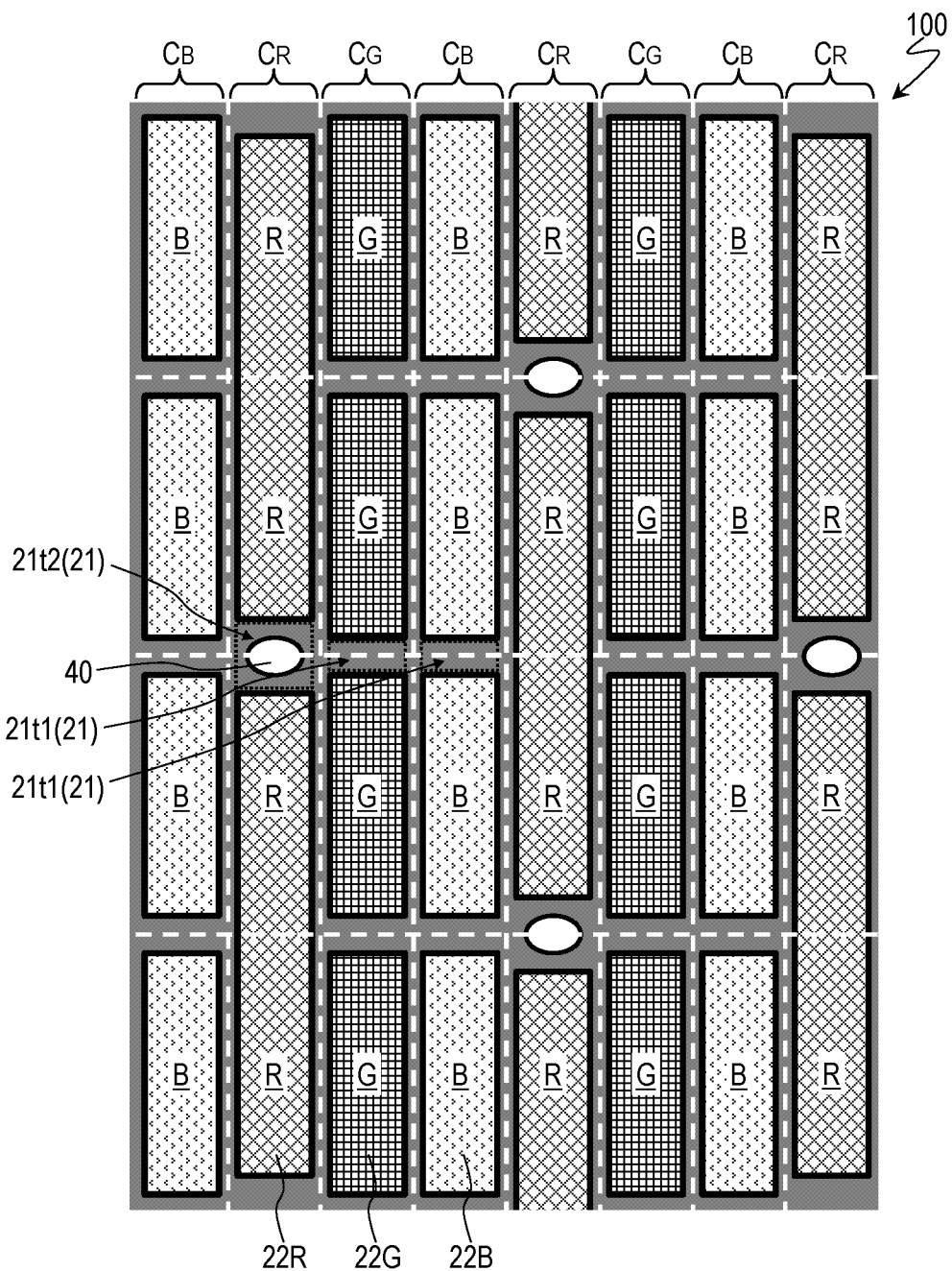
FIG. 4 is a schematic plan view illustrating the liquid crystal display device 100, in which a region corresponding to 32 (4 rows and 8 columns) pixels is illustrated.

Hereinafter, the structures of the light-shielding layer 21 and the color filter layer 22, and the arrangement of the columnar spacers 40 are described in detail with reference to FIG. 4 also. FIG. 4 is a plan view illustrating the arrangement of the light-shielding layer 21, the red color filters 22R, the green color filters 22G, the blue color filters 22B, and the columnar spacers 40; and a region corresponding to 32 pixels (4 rows and 8 columns) is illustrated.

As illustrated in FIGS. 3(a), (b), and (c) and FIG. 4, the TFT light-shielding portion 21t2 in the red pixel column $C_R$ has a larger area than the TFT light-shielding portions 21t1 in the green pixel column $C_G$ and the blue pixel column $C_B$. Hereinafter, the latter TFT light-shielding portion 21t1 having a relatively small area is referred to as a "first TFT light-shielding portion", and the former TFT light-shielding portion 21t2 having a relatively large area is referred to as a "second TFT light-shielding portion".

In the green pixel column $C_G$ and the blue pixel column $C_B$, one first TFT light-shielding portion 21t1 is provided for each row in the light-shielding layer 21. In contrast, in the red pixel column $C_R$, one second TFT light-shielding portion 21t2 is provided every two rows in the light-shielding layer 21.

The columnar spacers 40 are arranged so that each does not overlap the first TFT light-shielding portion 21t1 but does overlap the second TFT light-shielding portion 21t2. In other words, the columnar spacers 40 are not disposed in the green pixel column $C_G$ or the blue pixel column $C_B$ and are disposed only in the red pixel column $C_R$.

According to the liquid crystal display device 100 of this embodiment having the above-described structure, the aperture ratio can be improved while suppressing occurrence of chromaticity deviation. The reason for this will now be described by comparing the device to a liquid crystal display device of a comparative example, in which a technology proposed in International Application PCT/JP2015/084786 is simply employed.

As has been described, when the oxide semiconductor TFT is irradiated with light, the threshold voltage undergoes a minus shift. This deterioration of the TFT characteristics is caused by visible light having a wavelength of 450 nm or less. According to the technology described in International Application PCT/JP2015/084786, at least one color filter among the color filters of multiple types contained in the color filter layer has spectral characteristics set so as to substantially eliminate transmission of light in a short wavelength region (specifically, visible light having a wavelength of 450 nm or less); thus, for pixels provided with such color filters, deterioration (minus shift of the threshold voltage) of TFT characteristics can be suppressed even when the width of the TFT light-shielding portions is decreased from the related art or the TFT light-shielding portions are omitted. Thus, the aperture ratio can be improved.

Figure 14:
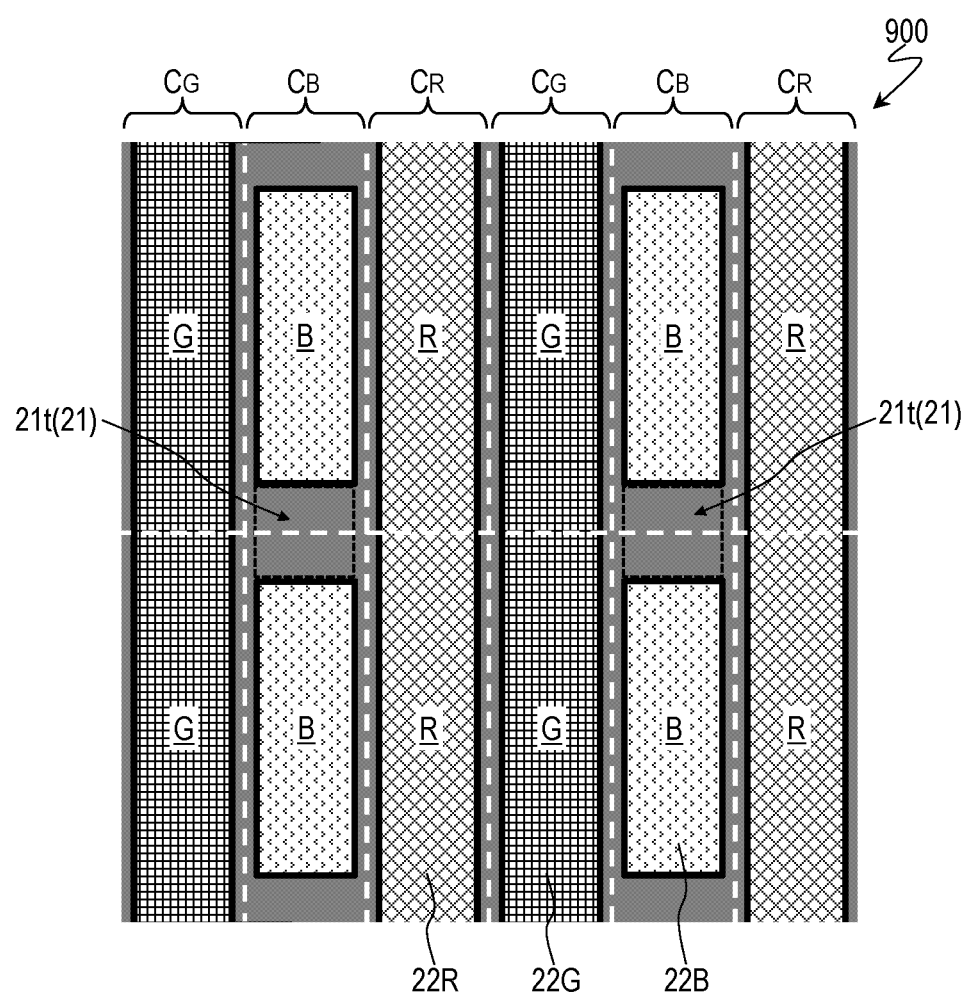
FIG. 14 is a schematic plan view illustrating a liquid crystal display device 900 of a comparative example, in which a region corresponding to 12 (2 rows and 6 columns) pixels is illustrated.

FIG. 14 illustrates a liquid crystal display device 900 of a comparative example. The liquid crystal display device 900 illustrated in FIG. 14 has blue color filters 22B that have an average transmittance greater than 0.2% for visible light having a wavelength of 450 nm or less. In contrast, each of the green color filters 22G and the red color filters 22R has an average transmittance of 0.2% or less for visible light having a wavelength of 450 nm or less. In other words, the green color filters 22G and the red color filters 22R are all short-wavelength-light-absorbing color filters.

The light-shielding layer 21 of the liquid crystal display device 900 has one TFT light-shielding portion 21t for every row in the blue pixel column $C_B$. In contrast, in the green pixel column $C_G$ and the red pixel column $C_R$, the light-shielding layer 21 has no TFT light-shielding portions 21t.

As described above, in the liquid crystal display device 900 of the comparative example, the TFT light-shielding portions 21t in the green pixel column $C_G$ and the red pixel column $C_R$ are omitted, the aperture ratio is improved.

However, according to the liquid crystal display device 900, the aperture ratio of each of the green pixels G and the red pixels R is higher than the aperture ratio of the blue pixel B. Thus, when a typical backlight for liquid crystal display devices is used as the backlight (illuminating device), chromaticity deviation occurs. In particular, when the columnar spacers are arranged to overlap the TFT light-shielding portion 21t of the blue pixel column $C_B$, it is necessary to set the area of the TFT light-shielding portion 21t to a relatively large area (this is because alignment tends to be disturbed around the columnar spacers), and thus the chromaticity deviation becomes significant. Naturally, a special backlight having emission characteristics set so as to eliminate chromaticity deviation can be used to suppress occurrence of chromaticity deviation. However, in this case, the manufacturing cost will rise.

In the liquid crystal display device 100 according to this embodiment, the columnar spacers 40 are arranged so as not to overlap the first TFT light-shielding portions 21t1 in the green pixel column $C_G$ and the blue pixel column $C_B$. Thus, the area of the first TFT light-shielding portion 21t1 may be relatively small, and thus the aperture ratios of the green pixels G and the blue pixels B can be improved.

The area of the second TFT light-shielding portion 21t2 in the red pixel column $C_R$ is larger than the area of the first TFT light-shielding portion 21t1; however, since the second TFT light-shielding portion 21t2 is provided every two rows, the aperture ratio of the red pixel R can also be improved. Note that although there are TFTs 2 in the red pixel column $C_R$ that are not shielded from light by the second TFT light-shielding portions 21t2, the average transmittance of the red color filters 22R for visible light having a wavelength of 450 nm or less is 0.2% or less (in other words, the red color filters 22R are short-wavelength-light-absorbing color filters); thus, deterioration of TFT characteristics (minus shift of threshold voltage) can be sufficiently suppressed. Thus, reliability of the TFTs 2, which are oxide semiconductor TFTs, is not compromised.

In the liquid crystal display device 100, the TFT light-shielding portions 21t1 and 21t2 are provided in all of the red pixel columns $C_R$, the green pixel columns $C_G$, and blue pixel columns $C_B$; thus, aperture ratios of the red pixels R, the green pixels G, and the blue pixels B (in other words, the aperture ratios of the plurality of pixels) can be easily made substantially the same among one another. Thus, even when a typical backlight is used, occurrence of chromaticity deviation can be suppressed.

In order to adjust the average transmittance of the red color filters 22R to 0.2% or less for visible light having a wavelength of 450 nm or less, the material for the red color filters 22R may be appropriately selected. The material for the red color filters 22R is not particularly limited as long as the average transmittance for visible light having a wavelength of 450 nm or less is 0.2% or less. For example, the average transmittance for visible light having a wavelength of 450 nm or less can be adjusted to 0.2% or less by adjusting the transmission characteristics by using a yellow pigment (in other words, by adding a yellow pigment) in addition to the red pigment as the pigment to be contained in a photosensitive resin.

The liquid crystal display device 100 according to this embodiment can be manufactured as follows, for example.

First, a method for preparing the counter substrate 20 is described.

First, a light-shielding film is deposited on a transparent substrate (for example, a glass substrate) 20a, and the light-shielding film is patterned into a desired shape by a photolithographic process so as to form a light-shielding layer 21 that includes portions 21s that overlap the signal lines 12 and portions (TFT light-shielding portions) 21t1 and 21t2 that overlap at least the channel regions 2ac of the TFTs 2. The light-shielding layer 21 is, for example, a Ti layer having a thickness of 200 nm. The material for the light-shielding layer 21 is not limited to the metal material described as examples, and may be, for example, a black photosensitive resin material.

Next, red color filters 22R, green color filters 22G, and blue color filters 22B are sequentially formed in the regions corresponding to red pixels R, green pixels G, and blue pixels B so as form a color filter layer 22. Examples of the materials for the red color filters 22R, the green color filters 22G, and the blue color filters 22B include colored photosensitive resin materials.

Subsequently, a transparent conductive film is deposited on the color filter layer 22 by a sputtering technique so as to form a counter electrode 23. The counter electrode 23 is, for example, an ITO layer having a thickness of 100 nm.

Next, columnar spacers 40 are formed so as to overlap the second TFT light-shielding portions 21t2. The columnar spacers 40 are, for example, formed of a photosensitive resin material. Lastly, an alignment film is formed on the counter electrode 23, and the counter substrate 20 is obtained as a result.

Next, a method for preparing the TFT substrate 10 is described.

First, a conductive film is deposited on a transparent substrate (for example, a glass substrate) 10a, and the conductive film is patterned into a desired shape by a photolithographic process so as to form gate electrodes 2g and the scanning lines 11. The gate electrodes 2g and the scanning lines 11 have, for example, a multilayer structure in which a TaN layer having a thickness of 30 nm and a W layer having a thickness of 300 nm are stacked in this order.

Next, a gate insulating layer 15 is formed so as to cover the gate electrodes 2g and the scanning lines 11. The gate insulating layer 15 has, for example, a multilayer structure in which a SiNx layer having a thickness of 325 nm and a $SiO_2$ layer having a thickness of 50 nm are stacked in this order.

Subsequently, an oxide semiconductor film is deposited on the gate insulating layer 15, and the oxide semiconductor film is patterned into a desired shape by a photolithographic process so as to form an oxide semiconductor layer 2a. The oxide semiconductor layer 2a is, for example, an In—Ga—Zn—O-based semiconductor layer having a thickness of 50 nm.

Subsequently, a conductive film is deposited, and the conductive film is patterned into a desired shape by a photolithographic process so as to form source electrodes 2s, drain electrodes 2d, and signal lines 12. The source electrodes 2s, the drain electrodes 2d, and the signal lines 12 have, for example, a multilayer structure in which a Ti layer having a thickness of 30 nm, an Al layer having a thickness of 200 nm, and a Ti layer having a thickness of 100 nm are stacked in this order.

Next, an inorganic insulating layer 16 is formed so as to cover the oxide semiconductor layer 2a, the source electrodes 2s, the drain electrodes 2d, and the like. The inorganic insulating layer 16 is, for example, a $SiO_2$ layer having a thickness of 300 nm. Openings are formed in regions in the inorganic insulating layer 16 that will form contact holes CH.

Subsequently, an organic insulating layer 17 for planarization is formed on the inorganic insulating layer 16. The organic insulating layer 17 is, for example, formed of a photosensitive resin. Openings are formed in regions in the organic insulating layer 17 that will form contact holes CH.

Subsequently, a transparent conductive film is deposited on the organic insulating layer 17, and the transparent conductive film is patterned into a desired shape by a photolithographic process so as to form an auxiliary capacitor counter electrode 14. The auxiliary capacitor counter electrode 14 is, for example, an IZO layer having a thickness of 100 nm.

Next, a dielectric layer 18 is formed so as to cover the auxiliary capacitor counter electrode 14. The dielectric layer 18 is, for example, a SiN layer having a thickness of 100 nm. Openings are formed in regions in the dielectric layer 18 that will form contact holes CH.

Subsequently, a transparent conductive film is deposited on the dielectric layer 18, and the transparent conductive film is patterned into a desired shape by a photolithographic process so as to form pixel electrodes 13. The pixel electrodes 13 are, for example, an IZO layer having a thickness of 100 nm. Subsequently, an alignment film is formed on the entire surface so as to cover the pixel electrodes 13, and a TFT substrate 10 is obtained as a result.

The TFT substrate 10 and the counter substrate 20 prepared as described above are bonded to each other, and a liquid crystal material is injected into a gap between the two substrates to form a liquid crystal layer 30. Subsequently, the obtained structure is cut into individual panels to complete preparation of the liquid crystal display device 100.

It should be noted that the aperture ratios of the red pixels R, the green pixels G, and the blue pixels B do not have to be the same. If needed, the aperture ratio may differ among the red pixels R, the green pixels G, and the blue pixels B. If the aperture ratio is set to differ among the red pixels R, the green pixels G, and the blue pixels B, the emission characteristics of the backlight are preferably appropriately adjusted to suppress occurrence of the chromaticity deviation.

Figure 5:
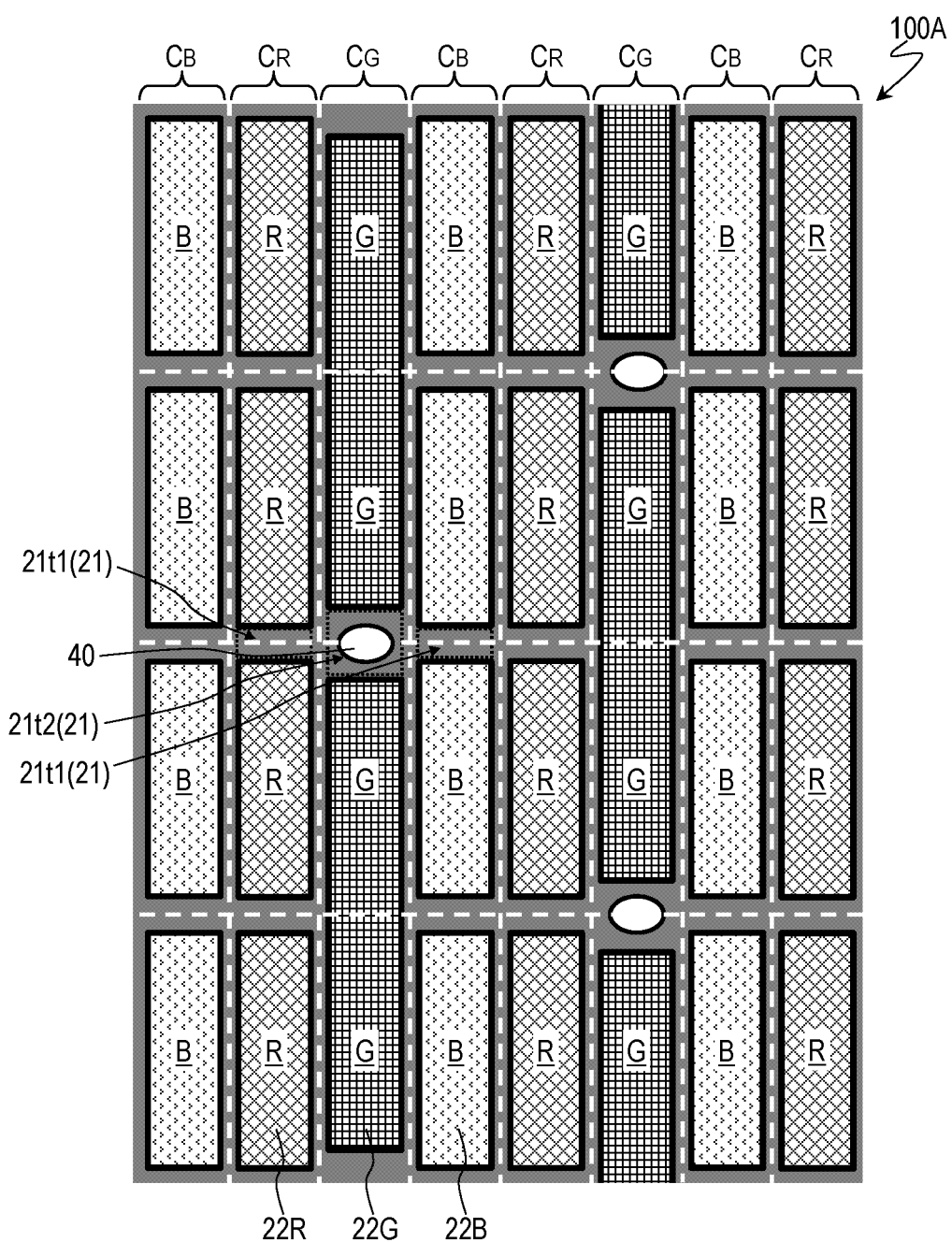
FIG. 5 is a schematic plan view illustrating a liquid crystal display device 100A according to an embodiment of the present invention, in which a region corresponding to 32 (4 rows and 8 columns) pixels is illustrated.

FIG. 5 illustrates another liquid crystal display device 100a according to this embodiment. FIG. 5 is a plan view illustrating the arrangement of the light-shielding layer 21, the red color filters 22R, the green color filters 22G, the blue color filters 22B, and the columnar spacers 40; and a region corresponding to 32 pixels (4 rows and 8 columns) is illustrated. Hereinafter, the differences between the liquid crystal display device 100A illustrated in FIG. 5 and the liquid crystal display device 100 illustrated in FIG. 1 etc., are mainly described.

In the liquid crystal display device 100A, each of the blue color filters 22B and the red color filters 22R has an average transmittance greater than 0.2% for visible light having a wavelength of 450 nm or less. In contrast, the green color filters 22G have an average transmittance of 0.2% or less for visible light having a wavelength of 450 nm or less. In other words, the green color filters 22G are short-wavelength-light-absorbing color filters.

In the liquid crystal display device 100A, the TFT light-shielding portion 21t2 in the green pixel column $C_G$ has a larger area than the TFT light-shielding portions 21t1 in the red pixel column $C_R$ and blue pixel column $C_B$. In other words, the TFT light-shielding portions 21t1 in the red pixel column $C_R$ and the blue pixel column $C_B$ are the "first TFT light-shielding portions", and the TFT light-shielding portion 21t2 in the green pixel column $C_G$ is the "second TFT light-shielding portion".

In the red pixel column $C_R$ and the blue pixel column $C_B$, one first TFT light-shielding portion 21t1 is provided for each row in the light-shielding layer 21. In contrast, in the green pixel column $C_G$, one second TFT light-shielding portion 21t2 is provided every two rows in the light-shielding layer 21.

The columnar spacers 40 are arranged so that each does not overlap the first TFT light-shielding portion 21t1 but does overlap the second TFT light-shielding portion 21t2. In other words, the columnar spacers 40 are not disposed in the red pixel column $C_R$ and the blue pixel column $C_B$ and are disposed only in the green pixel column $C_G$.

As mentioned above, in the liquid crystal display device 100A, the columnar spacers 40 are arranged so as not to overlap the first TFT light-shielding portions 21t1 in the red pixel column $C_R$ and the blue pixel column $C_B$. Thus, the area of the first TFT light-shielding portion 21t1 may be relatively small, and thus the aperture ratios of the red pixels R and the blue pixels B can be improved.

The area of the second TFT light-shielding portion 21t2 in the green pixel column $C_G$ is larger than the area of the first TFT light-shielding portion 21t1; however, since one second TFT light-shielding portion 21t2 is provided every two rows, the aperture ratio of the green pixels G can also be improved. Note that although there are TFTs 2 in the green pixel column $C_G$ that are not shielded from light by the second TFT light-shielding portions 21t2, the average transmittance of the green color filters 22G for visible light having a wavelength of 450 nm or less is 0.2% or less (in other words, the green color filters 22G are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 100A, the TFT light-shielding portions 21t1 and 21t2 are provided in all of the red pixel columns $C_R$, the green pixel columns $C_G$, and the blue pixel columns $C_B$; thus, aperture ratios of the red pixels R, the green pixels G, and the blue pixels B (in other words, the aperture ratios of the plurality of pixels) can be easily made substantially the same among one another. Thus, even when a typical backlight is used, occurrence of chromaticity deviation can be suppressed.

In order to adjust the average transmittance of the green color filters 22G to 0.2% or less for visible light having a wavelength of 450 nm or less, the material for the green color filters 22G may be appropriately selected. The material for the green color filters 22G is not particularly limited as long as the average transmittance for visible light having a wavelength of 450 nm or less is 0.2% or less. For example, the average transmittance for visible light having a wavelength of 450 nm or less can be adjusted to 0.2% or less by adjusting the transmission characteristics by using a yellow pigment (in other words, by adding a yellow pigment) in addition to the green pigment as the pigment to be contained in a photosensitive resin.

<Regarding Oxide Semiconductor>

The oxide semiconductor contained in the oxide semiconductor layer 2a may be an amorphous oxide semiconductor or a crystalline oxide semiconductor having a crystalline portion. Examples of the crystalline oxide semiconductor include polycrystal oxide semiconductors, microcrystal oxide semiconductors, and crystalline oxide semiconductors having a c axis substantially perpendicular to the layer surface.

The oxide semiconductor layer 2a may have a multilayer structure that includes two or more layers. When the oxide semiconductor layer 2a has a multilayer structure, the oxide semiconductor layer 2a may include an amorphous oxide semiconductor layer and a crystalline oxide semiconductor layer. Alternatively, two or more crystalline oxide semiconductor layers having different crystal structures may be included. Alternatively, two or more amorphous oxide semiconductor layers may be included. When the oxide semiconductor layer 2a has a two-layer structure including an upper layer and a lower layer, the energy gap of the oxide semiconductor contained in the upper layer is preferably larger than the energy gap of the oxide semiconductor contained in the lower layer. However, when the difference between the energy gaps of these layers is relatively small, the energy gap of the oxide semiconductor in the lower layer may be larger than the energy gap of the oxide semiconductor in the upper layer.

The materials, structure, and deposition method for the amorphous oxide semiconductor and the crystalline oxide semiconductors described above, the structure of the oxide semiconductor layer having a multilayer structure, etc., are described in, for example, Japanese Unexamined Patent Application Publication No. 2014-007399. For reference, the entire contents of the disclosure of the Japanese Unexamined Patent Application Publication No. 2014-007399 are incorporated in this description.

The oxide semiconductor layer 2a may contain at least one metal element selected from In, Ga, and Zn, for example. In this embodiment, the oxide semiconductor layer 2a contains, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio between In, Ga, and Zn (compositional ratio) is not particularly limited, for example, may be In:Ga:Zn=2:2:1, In:Ga:Zn=1:1:1, or In:Ga:Zn=1:1:2. This oxide semiconductor layer 2a can be formed of an oxide semiconductor film that contains an In—Ga Zn O-based semiconductor. A channel-etch-type TFT that has an active layer containing an oxide semiconductor, such as an In—Ga—Zn—O-based semiconductor, may also be referred to as a "CE-OS-TFT".

The In—Ga—Zn—O-based semiconductor may be amorphous or crystalline. The crystalline In—Ga—Zn—O-based semiconductor is preferably a crystalline In—Ga—Zn—O-based semiconductor having a c axis substantially perpendicular to the layer surface.

Note that the crystal structure of the crystalline In—Ga—Zn—O-based semiconductor is, for example, described in Japanese Unexamined Patent Application Publication No. 2014-007399 described above, Japanese Unexamined Patent Application Publication No. 2012-134475, and Japanese Unexamined Patent Application Publication No. 2014-209727. For reference, the entire contents of the disclosures of the Japanese Unexamined Patent Application Publication Nos. 2012-134475 and 2014-209727 are incorporated in this description. The TFT having an In—Ga—Zn—O-based semiconductor layer has high mobility (more than 20 times that of a-Si TFTs) and low leak current (less than one 100th of that of a-Si TFTs), and is thus suitable for drive TFTs (for example, TFTs disposed around the display region that includes pixels and included in drive circuits on the same substrate as the display region) and pixel TFTs (TFTs for pixels).

The oxide semiconductor layer 2a may contain another oxide semiconductor instead of the In—Ga—Zn—O-based semiconductor. For example, an In—Sn—Zn—O-based semiconductor (for example, $In_2O_3$—$SnO_2$-ZnO; InSnZnO) may be contained. The In—Sn—Zn—O-based semiconductor is a ternary oxide of In (indium), Sn(tin), and Zn (zinc). Alternatively, the oxide semiconductor layer 2a may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-semiconductor, or the like.

The TFT 2, which is an oxide semiconductor TFT, may be a "channel-etch-type TFT" or an "etch-stop-type TFT".

In the "channel-etch-type TFT", for example, as illustrated in FIGS. 3(a) to (c), no etch stop layer is formed on the channel region, and lower surfaces of channel-side end portions of the source and drain electrodes are arranged to contact the upper surface of the oxide semiconductor layer. The channel-etch-type TFT is, for example, formed by forming a conductive film for source and drain electrodes on an oxide semiconductor layer, and then performing a source-drain isolation. In the source-drain isolation step, a surface portion of the channel region may become etched.

In contrast, in the TFT in which an etch stop layer is formed on the channel region (etch-stop-type TFT), the lower surfaces of the channel-side end portions of the source and drain electrodes are located on the etch stop layer, for example. The etch-stop-type TFT is formed by, for example, forming an etch stop layer that covers a portion of the oxide semiconductor layer that will form a channel region, forming a conductive film for source and drain electrodes on the oxide semiconductor layer and the etch stop layer, and then performing source-drain isolation.

(Embodiment 2)

In Embodiment 1, one type of color filters among three types of color filters are the short-wavelength-light-absorbing color filters. In contrast, in this embodiment, two types of color filters among three types of color filters are the short-wavelength-light-absorbing color filters.

Figure 6:
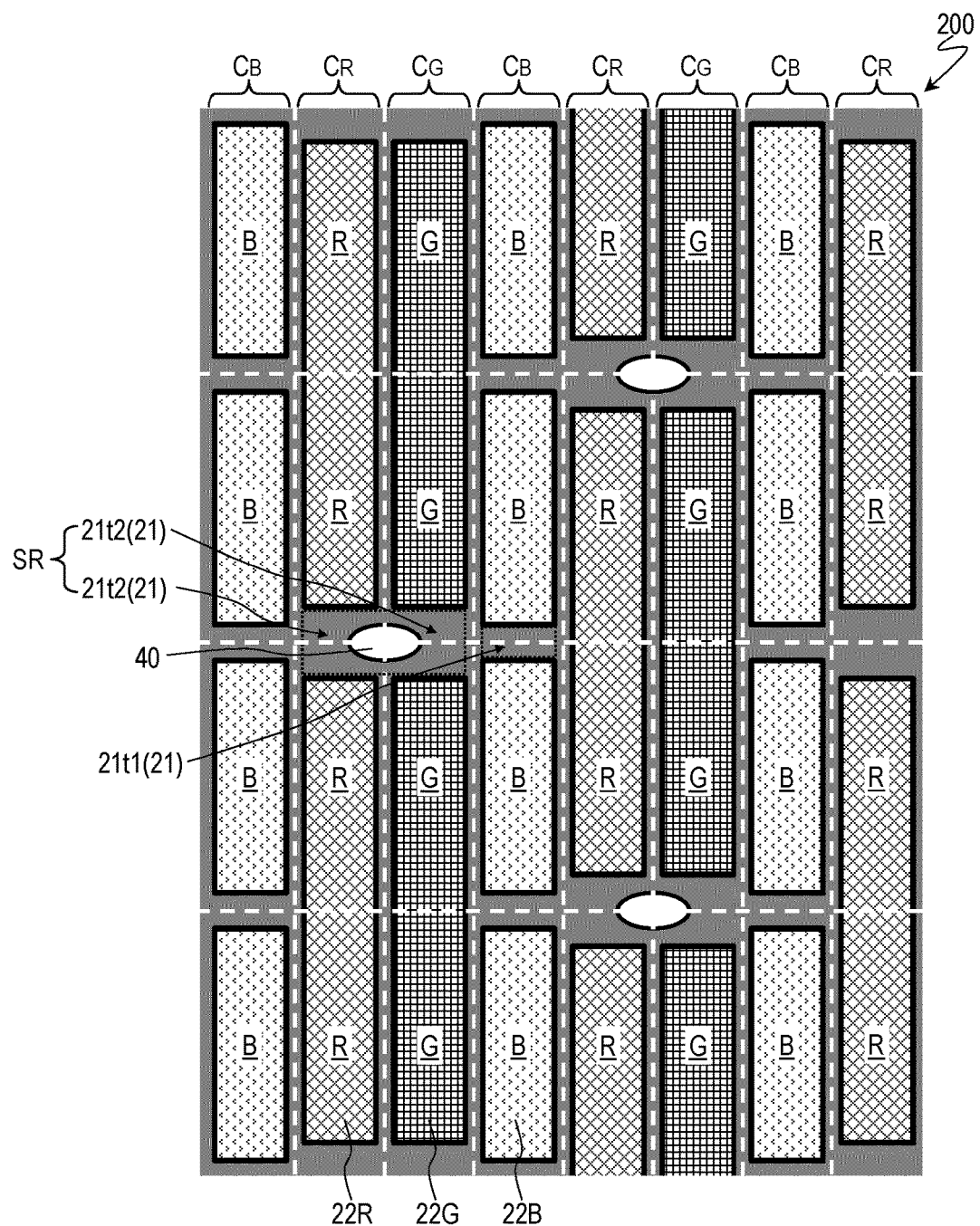
FIG. 6 is a schematic plan view illustrating a liquid crystal display device 200 according to an embodiment of the present invention, in which a region corresponding to 32 (4 rows and 8 columns) pixels is illustrated.

FIG. 6 illustrates a liquid crystal display device 200 according to this embodiment. FIG. 6 is a plan view illustrating the arrangement of the light-shielding layer 21, the red color filters 22R, the green color filters 22G, the blue color filters 22B, and the columnar spacers 40 in the liquid crystal display device 200; and a region corresponding to 32 pixels (4 rows and 8 columns) is illustrated. Hereinafter, the differences between the liquid crystal display device 200 and the liquid crystal display device 100 of Embodiment 1 are mainly described.

The liquid crystal display device 200 has blue color filters 22B that have an average transmittance greater than 0.2% for visible light having a wavelength of 450 nm or less. In contrast, each of the red color filters 22R and the green color filters 22G has an average transmittance of 0.2% or less for visible light having a wavelength of 450 nm or less. In other words, the red color filters 22R and the green color filters 22G are short-wavelength-light-absorbing color filters.

As illustrated in FIG. 6, in the liquid crystal display device 200, the TFT light-shielding portions 21t2 in the red pixel column $C_R$ and the green pixel column $C_G$ have a larger area than the TFT light-shielding portion 21t1 in the blue pixel column CB. In other words, the TFT light-shielding portion 21t1 in the blue pixel column $C_B$ is the "first TFT light-shielding portion", and the TFT light-shielding portions 21t2 in the red pixel column $C_R$ and the green pixel column $C_G$ are the "second TFT light-shielding portions".

In the blue pixel column $C_B$, one first TFT light-shielding portion 21t1 is provided for each row in the light-shielding layer 21. In contrast, in the red pixel column $C_R$ and the green pixel column $C_G$, one second TFT light-shielding portion 21t2 is provided every two rows in the light-shielding layer 21.

A second TFT light-shielding portion 21t2 in a particular red pixel column $C_R$ and a second TFT light-shielding portion 21t2 in a green pixel column CG adjacent to that red pixel column $C_R$ are continuously provided so as to define a light-shielding area SR that extends two pixels in the row direction.

The columnar spacers 40 are arranged so that each does not overlap the first TFT light-shielding portion 21t1 but does overlap the second TFT light-shielding portion 21t2. In other words, the columnar spacers 40 are not disposed in the blue pixel column $C_B$ and are disposed only in the red pixel column $C_R$ and the green pixel column $C_G$. Moreover, one columnar spacer 40 is disposed for each light-shielding area SR. More specifically, one columnar spacer 40 extends over two second TFT light-shielding portions 21t2, and the center thereof is arranged to lie at the boundary between the red pixel column $C_R$ and the green pixel column $C_G$.

As described above, in the liquid crystal display device 200 according to this embodiment, the columnar spacers 40 are arranged so as not to overlap the first TFT light-shielding portions 21t1 in the blue pixel column $C_B$. Thus, the area of the first TFT light-shielding portion 21t1 may be relatively small, and thus the aperture ratios of the blue pixels B can be improved.

The area of the second TFT light-shielding portions 21t2 in the red pixel column $C_R$ and the green pixel column $C_G$ is larger than the area of the first TFT light-shielding portion 21t1; however, since the second TFT light-shielding portion 21t2 is provided every two rows, the aperture ratios of the red pixels R and the green pixels G can also be improved. Note that although there are TFTs 2 in the red pixel column $C_R$ and the green pixel column $C_G$ that are not shielded from light by the second TFT light-shielding portions 21t2, the average transmittance of the red color filters 22R and the green color filters 22G for visible light having a wavelength of 450 nm or less is 0.2% or less (in other words, the red color filters 22R and the green color filters 22G are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 200, the TFT light-shielding portions 21t1 and 21t2 are provided in all of the red pixel columns $C_R$, the green pixel columns $C_G$, and blue pixel columns $C_B$; thus, aperture ratios of the red pixels R, the green pixels G, and the blue pixels B (in other words, the aperture ratios of the plurality of pixels) can be easily made substantially the same among one another. Thus, even when a typical backlight is used, occurrence of chromaticity deviation can be suppressed.

It should be noted that the aperture ratios of the red pixels R, the green pixels G, and the blue pixels B do not have to be the same. If needed, the aperture ratio may differ among the red pixels R, the green pixels G, and the blue pixels B. If the aperture ratio is set to differ among the red pixels R, the green pixels G, and the blue pixels B, the emission characteristics of the backlight are preferably appropriately adjusted to suppress occurrence of the chromaticity deviation.

(Embodiment 3)

Figure 7:
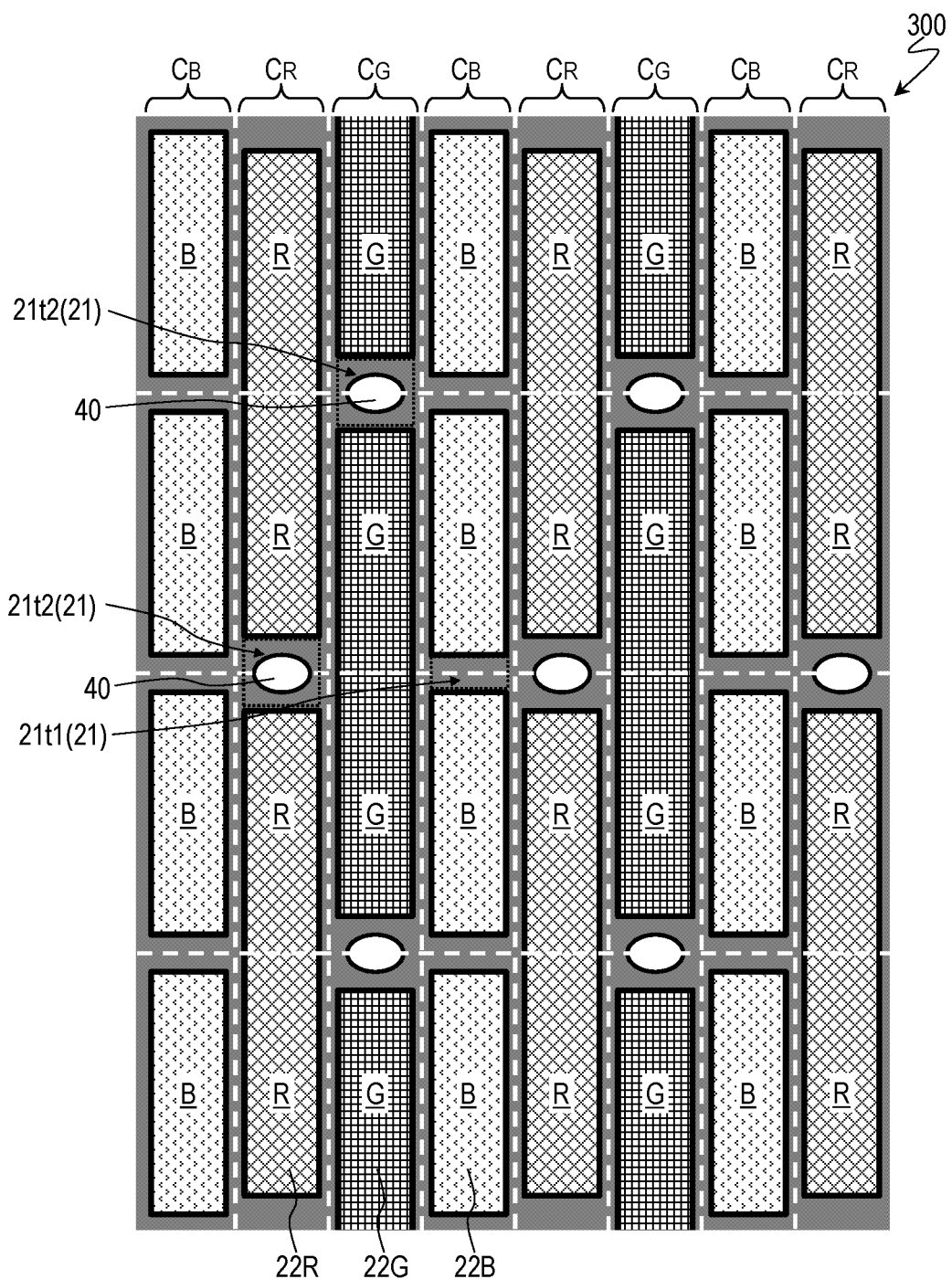
FIG. 7 is a schematic plan view illustrating a liquid crystal display device 300 according to an embodiment of the present invention, in which a region corresponding to 32 (4 rows and 8 columns) pixels is illustrated.

FIG. 7 illustrates a liquid crystal display device 300 according to this embodiment. FIG. 7 is a plan view illustrating the arrangement of the light-shielding layer 21, the red color filters 22R, the green color filters 22G, the blue color filters 22B, and the columnar spacers 40 in the liquid crystal display device 300; and a region corresponding to 32 pixels (4 rows and 8 columns) is illustrated. Hereinafter, the differences between the liquid crystal display device 300 and the liquid crystal display device 200 of Embodiment 2 are mainly described.

In the liquid crystal display device 300, as with the liquid crystal display device 200 of Embodiment 2, the blue color filters 22B have an average transmittance greater than 0.2% for visible light having a wavelength of 450 nm or less, and each of the red color filters 22R and the green color filters 22G has an average transmittance of 0.2% or less for visible light having a wavelength of 450 nm or less. In other words, the red color filters 22R and the green color filters 22G are short-wavelength-light-absorbing color filters.

As with the light-shielding layer 21 of the liquid crystal display device 200, the light-shielding layer 21 of the liquid crystal display device 300 has one first TFT light-shielding portion 21t1 for each row in the blue pixel column $C_B$, and one second TFT light-shielding portion 21t2 every two rows in the red pixel column $C_R$ and the green pixel column $C_G$.

However, in the liquid crystal display device 300, as illustrated in FIG. 7, a second TFT light-shielding portion 21t2 in a particular red pixel column $C_R$ and a second TFT light-shielding portion 21t2 in a green pixel column $C_G$ adjacent to this red pixel column $C_R$ are not continuous in the row direction. In other words, the second TFT light-shielding portion 21t2 in the red pixel column $C_R$ and the second TFT light-shielding portion 21t2 in the green pixel column $C_G$ are shifted from each other by one row.

The columnar spacers 40 are arranged so that each does not overlap the first TFT light-shielding portion 21t1 but does overlap the second TFT light-shielding portion 21t2. In other words, the columnar spacers 40 are not disposed in the blue pixel column $C_B$ and are disposed only in the red pixel column $C_R$ and the green pixel column $C_G$. Moreover, the columnar spacers 40 include a columnar spacer 40 arranged to overlap the second TFT light-shielding portion 21t2 in the red pixel column $C_R$ and a columnar spacer 40 arranged to overlap the second TFT light-shielding portion 21t2 in the green pixel column $C_G$.

As described above, in the liquid crystal display device 300 according to this embodiment, the columnar spacers 40 are arranged so as not to overlap the first TFT light-shielding portions 21t1 in the blue pixel column $C_B$. Thus, the area of the first TFT light-shielding portion 21t1 may be relatively small, and thus the aperture ratios of the blue pixels B can be improved.

The area of the second TFT light-shielding portions 21t2 in the red pixel column $C_R$ and the green pixel column $C_G$ is larger than the area of the first TFT light-shielding portion 21t1; however, since the second TFT light-shielding portion 21t2 is provided every two rows, the aperture ratios of the red pixels R and the green pixels G can also be improved. Note that although there are TFTs 2 in the red pixel column $C_R$ and the green pixel column $C_G$ that are not shielded from light by the second TFT light-shielding portions 21t2, the average transmittance of the red color filters 22R and the green color filters 22G for visible light having a wavelength of 450 nm or less is 0.2% or less (in other words, the red color filters 22R and the green color filters 22G are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 300, the TFT light-shielding portions 21t1 and 21t2 are provided in all of the red pixel columns $C_R$, the green pixel columns $C_G$, and blue pixel columns $C_B$; thus, aperture ratios of the red pixels R, the green pixels G, and the blue pixels B (in other words, the aperture ratios of the plurality of pixels) can be easily made substantially the same among one another. Thus, even when a typical backlight is used, occurrence of chromaticity deviation can be suppressed.

It should be noted that the aperture ratios of the red pixels R, the green pixels G, and the blue pixels B do not have to be the same. If needed, the aperture ratio may differ among the red pixels R, the green pixels G, and the blue pixels B. If the aperture ratio is set to differ among the red pixels R, the green pixels G, and the blue pixels B, the emission characteristics of the backlight are preferably appropriately adjusted to suppress occurrence of the chromaticity deviation.

Moreover, whereas one columnar spacer 40 is provided for two color display pixels in the liquid crystal display device 200 illustrated in FIG. 6, one columnar spacer 40 is provided for one color display pixel in the liquid crystal display device 300 of this embodiment, as illustrated in FIG. 7. As such, according to this embodiment, the columnar spacers 40 can be provided to all color display pixels without sacrificing the aperture ratio, and the flexibility of setting size, arrangement density, and layout of the columnar spacers 40 are enhanced. Moreover, the size and arrangement density of the columnar spacers 40 can be made different between the red pixel column $C_R$ and the green pixel column $C_G$; for example, the aperture ratio of the green pixels G can be made higher than the aperture ratio of other pixels (red pixels R and blue pixels B).

(Embodiment 4)

In Embodiments 1, 2, and 3, the light-shielding layer 21 has a second TFT light-shielding portion 21*t*2 every two rows in the pixel column in which the short-wavelength-light-absorbing color filters are provided; however, the embodiments of the present invention are not limited to this structure. It is sufficient if the light-shielding layer 21 has a second TFT light-shielding portion 21*t*2 every n rows (n represents an integer of 2 or more) in a pixel column in which short-wavelength-light-absorbing color filters are provided; thus, the structure is not limited to n=2, which is the structure described as examples in Embodiments 1, 2, and 3, and n may be n≥3.

Figure 8:
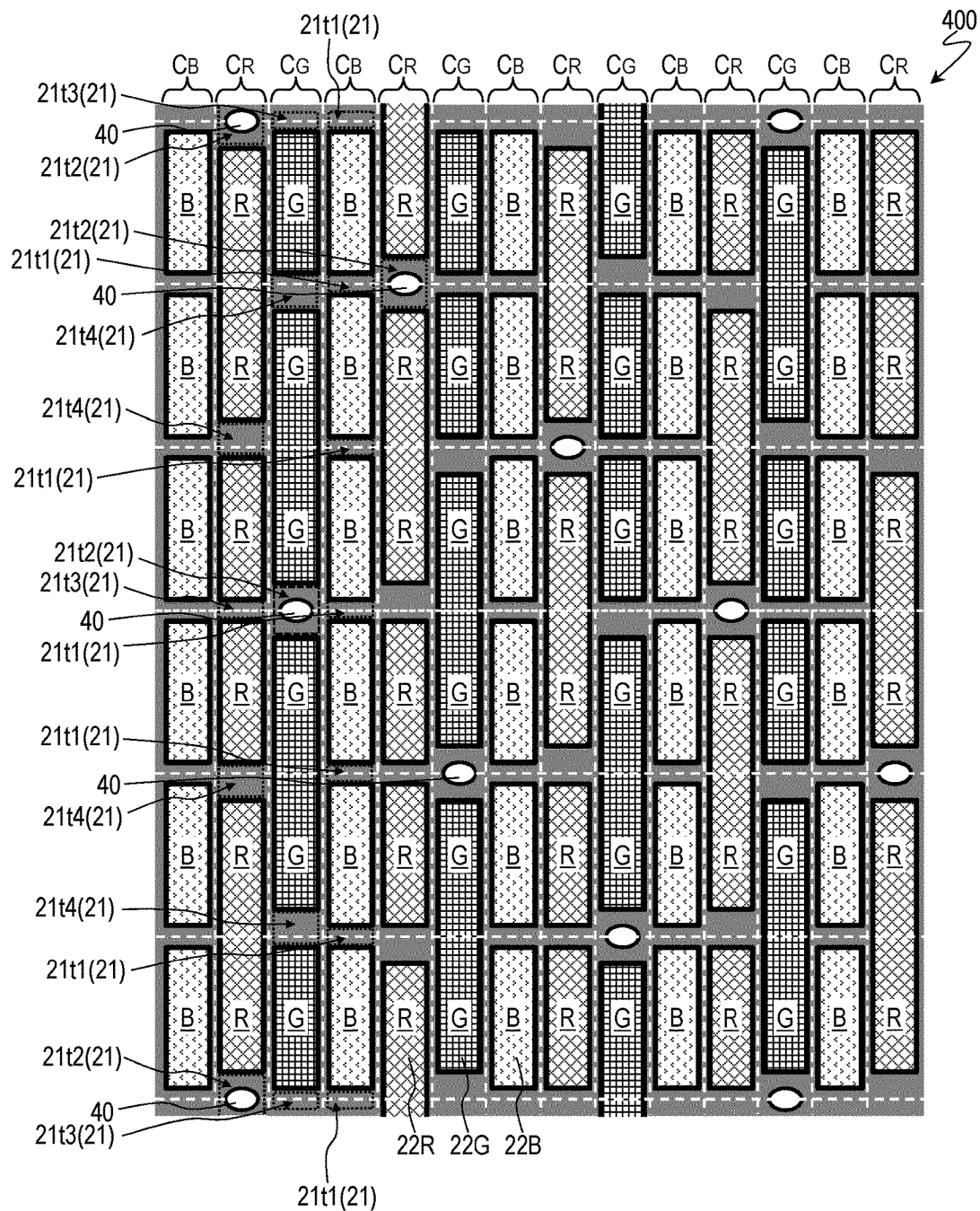
FIG. 8 is a schematic plan view illustrating a liquid crystal display device 400 according to an embodiment of the present invention, in which a region corresponding to 84 (6 rows and 14 columns) pixels is illustrated.

FIG. 8 illustrates a liquid crystal display device 400 according to this embodiment. FIG. 8 is a plan view illustrating the arrangement of the light-shielding layer 21, the red color filters 22R, the green color filters 22G, the blue color filters 22B, and the columnar spacers 40 in the liquid crystal display device 400; and a region corresponding to 84 pixels (6 rows and 14 columns) is illustrated. Hereinafter, the differences between the liquid crystal display device 400 and the liquid crystal display device 300 of Embodiment 3 are mainly described.

In the liquid crystal display device 400, as with the liquid crystal display device 300 of Embodiment 3, the blue color filters 22B have an average transmittance greater than 0.2% for visible light having a wavelength of 450 nm or less, and each of the red color filters 22R and the green color filters 22G has an average transmittance of 0.2% or less for visible light having a wavelength of 450 nm or less. In other words, the red color filters 22R and the green color filters 22G are short-wavelength-light-absorbing color filters.

As illustrated in FIG. 8, in the blue pixel column $C_B$, the light-shielding layer 21 of the liquid crystal display device 400 has one first TFT light-shielding portion 21*t*1 for each row as with the light-shielding layer 21 of the liquid crystal display device 200. In contrast, in the red pixel column $C_R$ and the green pixel column $C_G$, one second TFT light-shielding portion 21*t*2 is provided every six rows in the light-shielding layer 21 of the liquid crystal display device 400.

Furthermore, a second TFT light-shielding portion 21*t*2 in a particular red pixel column $C_R$ and a second TFT light-shielding portion 21*t*2 in a green pixel column $C_G$ adjacent to this red pixel column $C_R$ are not continuous in the row direction, and the second TFT light-shielding portion 21*t*2 in the red pixel column $C_R$ and the second TFT light-shielding portion 21*t*2 in the green pixel column $C_G$ are shifted from each other by 3 rows.

Furthermore, in each of the red pixel column $C_R$ and the green pixel column $C_G$, the light-shielding layer 21 has, in addition to the second TFT light-shielding portion 21*t*2, a third TFT light-shielding portion 21*t*3 and a fourth TFT light-shielding portion 21*t*4 that have a smaller area than the second TFT light-shielding portion 21*t*2. The area of the third TFT light-shielding portion 21*t*3 is equal to the first TFT light-shielding portion 21*t*1 in the blue pixel column $C_B$, and the area of the fourth TFT light-shielding portion 21*t*4 is larger than the area of the first TFT light-shielding portion 21*t*1 and smaller than the area of the second TFT light-shielding portion 21*t*2. The third TFT light-shielding portion 21*t*3 and the fourth TFT light-shielding portion 21*t*4 in the red pixel column $C_R$ are provided so that the aperture ratios of the red pixels R constituting the red pixel column $C_R$ are the same. The third TFT light-shielding portion 21*t*3 and the fourth TFT light-shielding portion 21*t*4 in the green pixel column $C_G$ are provided so that the aperture ratios of the green pixels G constituting the green pixel column $C_G$ are the same.

The columnar spacers 40 are arranged so that each does not overlap the first TFT light-shielding portion 21*t*1 but does overlap the second TFT light-shielding portion 21*t*2. In other words, the columnar spacers 40 are not disposed in the blue pixel column $C_B$ and are disposed only in the red pixel column $C_R$ and the green pixel column $C_G$. Moreover, the columnar spacers 40 include a columnar spacer 40 arranged to overlap the second TFT light-shielding portion 21*t*2 in the red pixel column $C_R$ and a columnar spacer 40 arranged to overlap the second TFT light-shielding portion 21*t*2 in the green pixel column $C_G$. In this embodiment, as illustrated in FIG. 8, one columnar spacer 40 is provided for three color display pixels.

As described above, in the liquid crystal display device 400 according to this embodiment, the columnar spacers 40 are arranged so as not to overlap the first TFT light-shielding portions 21*t*1 in the blue pixel column $C_B$. Thus, the area of the first TFT light-shielding portion 21*t*1 may be relatively small, and thus the aperture ratios of the blue pixels B can be improved.

The area of the second TFT light-shielding portions 21*t*2 in the red pixel column $C_R$ and the green pixel column $C_G$ is larger than the area of the first TFT light-shielding portion 21*t*1; however, since the second TFT light-shielding portion 21*t*2 is provided every six rows, the aperture ratios of the red pixels R and the green pixels G can also be improved. Note that although there are TFTs 2 in the red pixel column $C_R$ and the green pixel column $C_G$ that are not shielded from light by the second TFT light-shielding portions 21*t*2, the average transmittance of the red color filters 22R and the green color filters 22G for visible light having a wavelength of 450 nm or less is 0.2% or less (in other words, the red color filters 22R and the green color filters 22G are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 400, the TFT light-shielding portions 21*t*1, 21*t*2, 21*t*3, and 21*t*4 are provided in all of the red pixel columns $C_R$, the green pixel columns $C_G$, and blue pixel columns $C_B$; thus, aperture ratios of the red pixels R, the green pixels G, and the blue pixels B (in other words, the aperture ratios of the plurality of pixels) can be easily made substantially the same among one another. Thus, even when a typical backlight is used, occurrence of chromaticity deviation can be suppressed.

As such, according to this embodiment also, the columnar spacers 40 can be provided without sacrificing the aperture ratio, and the flexibility of setting size, arrangement density, and layout of the columnar spacers 40 are enhanced.

It should be noted that the aperture ratios of the red pixels R, the green pixels G, and the blue pixels B do not have to be the same. If needed, the aperture ratio may differ among the red pixels R, the green pixels G, and the blue pixels B. If the aperture ratio is set to differ among the red pixels R, the green pixels G, and the blue pixels B, the emission characteristics of the backlight are preferably appropriately adjusted to suppress occurrence of the chromaticity deviation.

(Embodiment 5)

In Embodiments 1, 2, 3, and 4, the pixels include red pixels R, green pixels G, and blue pixels B, and one color display pixel is constituted by three pixels (red pixel R, green pixel G, and blue pixel B) that display colors different from one another. However, the embodiments of the present invention are not limited to such a structure; and pixels may include pixels other than the red pixels R, the green pixels G, and the blue pixels B (pixels that display a color other than red, green, and blue), and one color display pixel may be constituted by four or more pixels that display colors different from one another.

Figure 9:
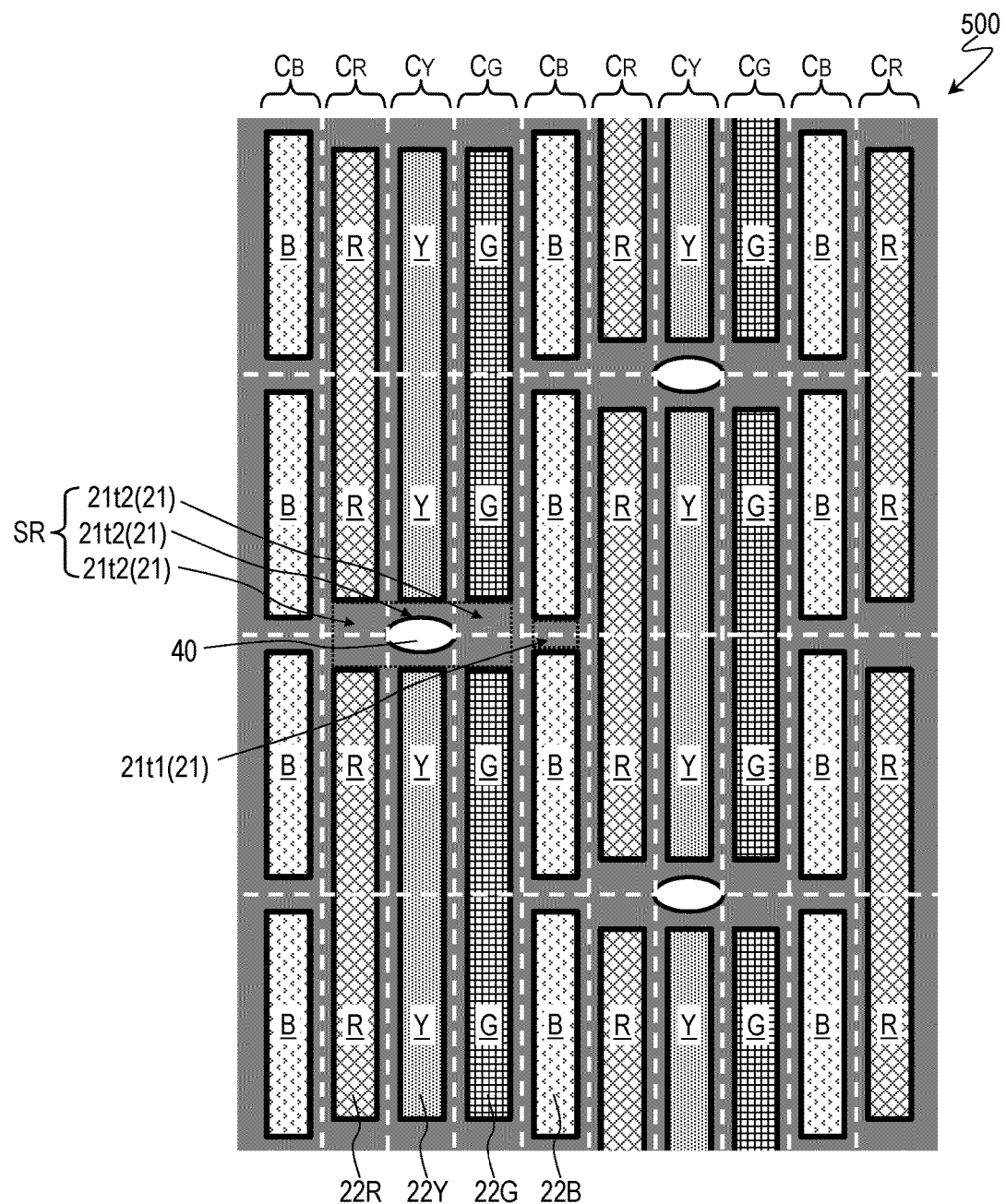
FIG. 9 is a schematic plan view illustrating a liquid crystal display device 500 according to an embodiment of the present invention, in which a region corresponding to 40 (4 rows and 10 columns) pixels is illustrated.

FIG. 9 illustrates a liquid crystal display device 500 according to this embodiment. FIG. 9 is a plan view illustrating the arrangement of the light-shielding layer 21, the red color filters 22R, the green color filters 22G, the blue color filters 22B, yellow color filters 22Y, and the columnar spacers 40 in the liquid crystal display device 500; and a region corresponding to 40 pixels (4 rows and 10 columns) is illustrated. Hereinafter, the differences between the liquid crystal display device 500 and the liquid crystal display device 100 of Embodiment 1 are mainly described.

As illustrated in FIG. 9, in the liquid crystal display device 500, the pixels include, in addition to the red pixels R, the green pixels G, and the blue pixels B, yellow pixels Y that display yellow. Four pixels (a red pixel R, a green pixel G, a blue pixel B, and a yellow pixel Y) that display colors different from one another constitute one color display pixel. The arrangement of the pixels is a stripe arrangement that includes, in addition to the red pixel column $C_R$, the green pixel column $C_G$, and the blue pixel column $C_B$, a yellow pixel column $C_Y$. In the yellow pixel column $C_Y$, yellow color filters 22Y that transmit yellow light are provided.

The liquid crystal display device 500 has blue color filters 22B that have an average transmittance greater than 0.2% for visible light having a wavelength of 450 nm or less. In contrast, each of the red color filters 22R, the green color filters 22G, and the yellow color filters 22Y has an average transmittance of 0.2% or less for visible light having a wavelength of 450 nm or less. In other words, the red color filters 22R, the green color filters 22G, and the yellow filters 22Y are short-wavelength-light-absorbing color filters.

As illustrated in FIG. 9, the TFT light-shielding portions 21t2 in the red pixel column $C_R$, the green pixel column $C_G$, and the yellow pixel column $C_Y$ have a larger area than the TFT light-shielding portion 21t1 in the blue pixel column $C_B$. In other words, the TFT light-shielding portion 21t1 in the blue pixel column $C_B$ is the "first TFT light-shielding portion", and the TFT light-shielding portions 21t2 in the red pixel column $C_R$, the green pixel column $C_G$, and the yellow pixel column $C_Y$ are the "second TFT light-shielding portions".

In the blue pixel column $C_B$, one first TFT light-shielding portion 21t1 is provided for each row in the light-shielding layer 21. In contrast, in the red pixel column $C_R$, the green pixel column $C_G$, and the yellow pixel column $C_Y$, one second TFT light-shielding portion 21t2 is provided every two rows in the light-shielding layer 21.

A second TFT light-shielding portion 21t2 in a particular yellow pixel column $C_Y$ and second TFT light-shielding portions 21t2 in a red pixel column $C_R$ and a green pixel column $C_G$ adjacent to that yellow pixel column $C_Y$ are continuously provided so as to define a light-shielding area SR that extends three pixels in the row direction.

The columnar spacers 40 are arranged so that each does not overlap the first TFT light-shielding portion 21t1 but does overlap the second TFT light-shielding portion 21t2.

In other words, no columnar spacers 40 are provided in the blue pixel column $C_B$. Moreover, one columnar spacer 40 is disposed for each light-shielding area SR. More specifically, each columnar spacer 40 is disposed to overlap the second TFT light-shielding portion 21t2 in the yellow pixel column $C_Y$ in the light-shielding area SR.

As described above, in the liquid crystal display device 500 according to this embodiment, the columnar spacers 40 are arranged so as not to overlap the first TFT light-shielding portions 21t1 in the blue pixel column $C_B$. Thus, the area of the first TFT light-shielding portion 21t1 may be relatively small, and thus the aperture ratios of the blue pixels B can be improved.

The area of the second TFT light-shielding portions 21t2 in the red pixel column $C_R$, the green pixel column $C_G$, and the yellow pixel column $C_Y$ is larger than the area of the first TFT light-shielding portion 21t1; however, since the second TFT light-shielding portion 21t2 is provided every two rows, the aperture ratios of the red pixels R, the green pixels G, and the yellow pixels Y can also be improved. Note that although there are TFTs 2 in the red pixel column $C_R$, the green pixel column $C_G$, and the yellow pixel column $C_Y$ that are not shielded from light by the second TFT light-shielding portions 21t2, the average transmittance of the red color filters 22R, the green color filters 22G, and the yellow color filters 22Y for visible light having a wavelength of 450 nm or less is 0.2% or less (in other words, the red color filters 22Rm the green color filters 22G, and the yellow color filters 22Y are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 500, the TFT light-shielding portions 21t1 and 21t2 are provided in all of the red pixel columns $C_R$, the green pixel columns $C_G$, the blue pixel columns $C_B$, and the yellow pixel column $C_Y$; thus, aperture ratios of the red pixels R, the green pixels G, the blue pixels B, and the yellow pixel Y (in other words, the plurality of pixels) can be easily made substantially the same among one another.

It should be noted that the aperture ratios of the red pixels R, the green pixels G, the blue pixels B, and the yellow pixels Y do not have to be the same. If needed, the aperture ratio may differ among the red pixels R, the green pixels G, the blue pixels B, and the yellow pixels Y.

As such, according to this embodiment also, the columnar spacers 40 can be provided without sacrificing the aperture ratio, and the flexibility of setting size, arrangement density, and layout of the columnar spacers 40 are enhanced.

Note that, in the structure illustrated in FIG. 9, each of the columnar spacers 40 is arranged to overlap the second TFT light-shielding portion 21t2 in the yellow pixel column $C_Y$ in the light-shielding area SR; alternatively, the columnar spacer 40 may be arranged to overlap two or more second TFT light-shielding portions 21t2 in the light-shielding area SR.

In this embodiment, an example in which three types of color filters among the four types of color filters are short-wavelength-light-absorbing color filters is illustrated; however, the embodiments of the present invention are not limited to this. One or two types of color filters among the four type of color filters may be short-wavelength-light-absorbing color filters.

(Embodiment 6)

Figure 10:
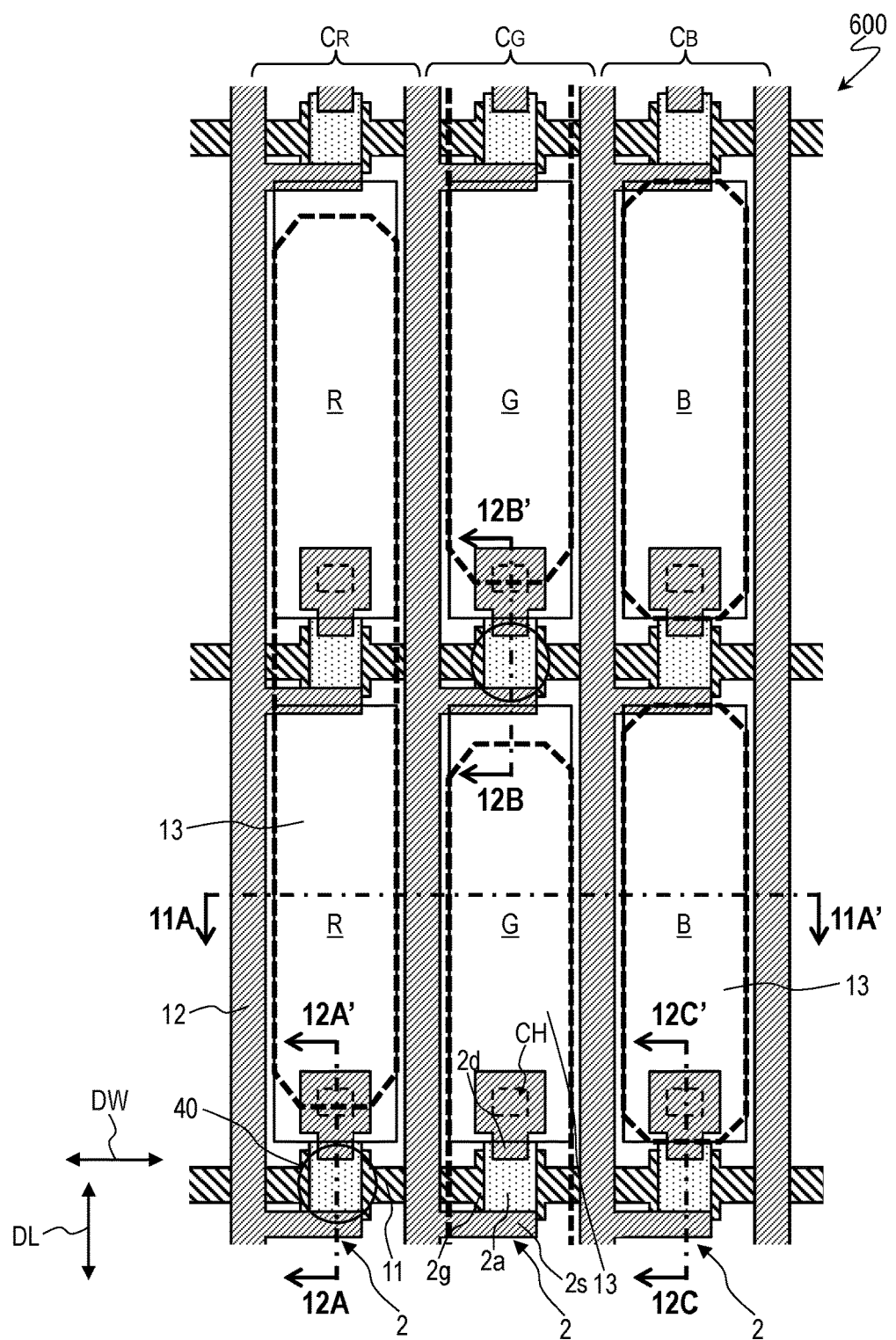
FIG. 10 is a schematic plan view of a liquid crystal display device 600 according to one embodiment of the present invention.
Figure 11:
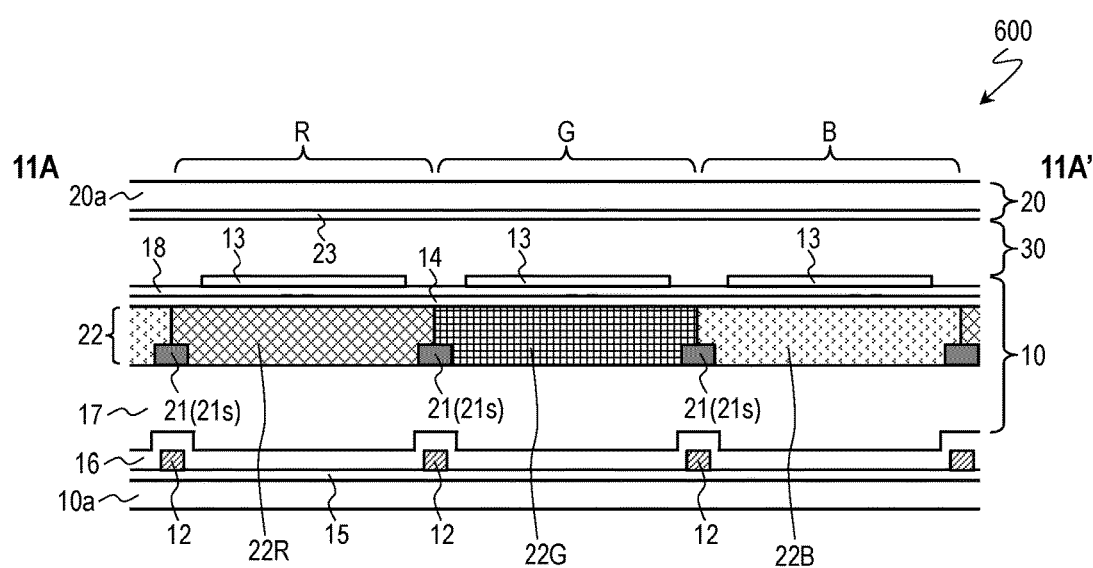
FIG. 11 is a schematic cross-sectional view of the liquid crystal display device 600 taken along line 11A-11A' in FIG. 10.
Figure 12:
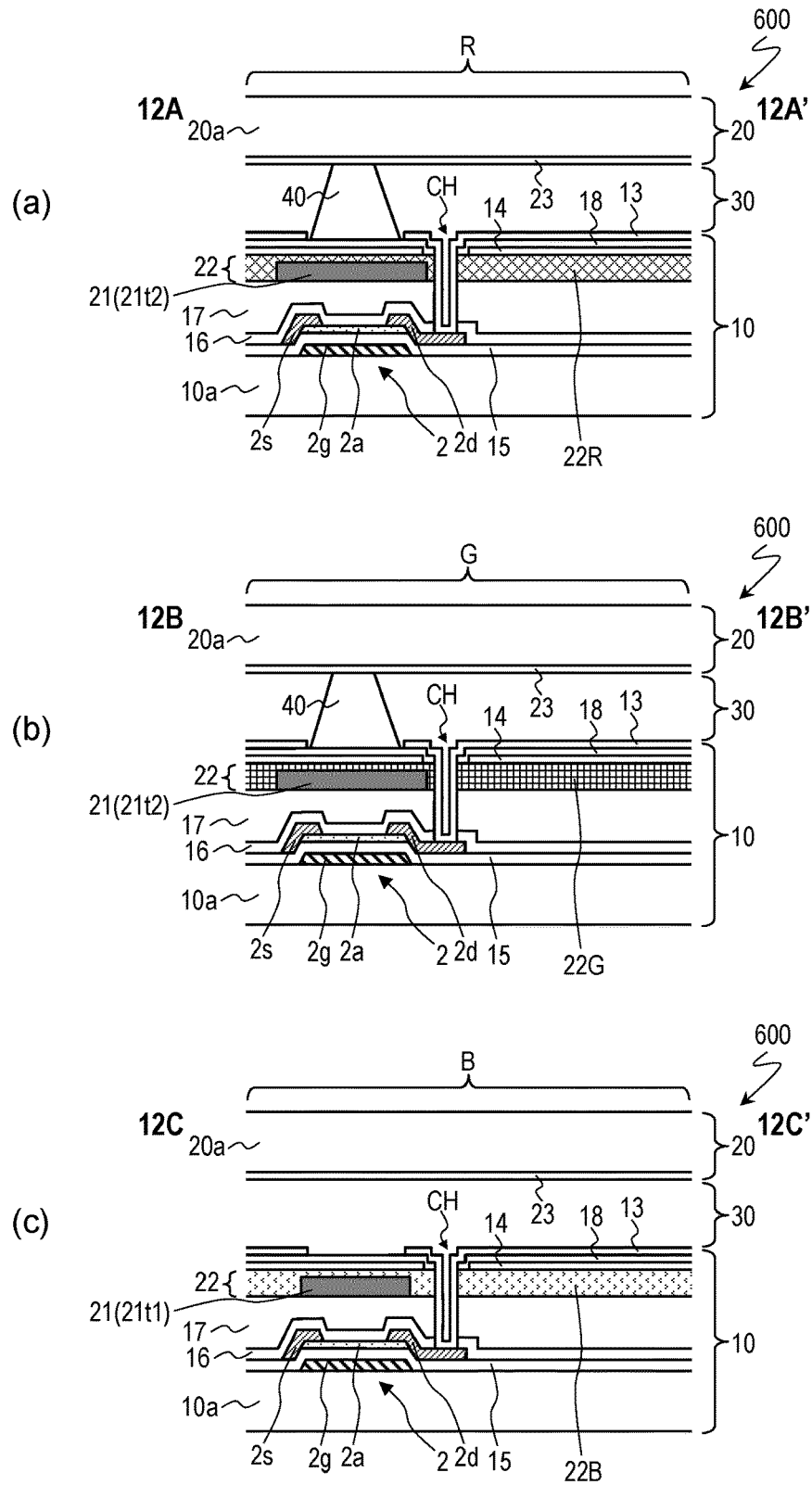
FIGS. 12(a), (b), and (c) are respectively schematic cross-sectional views of the liquid crystal display device 600 taken along line 12A-12A', 12B-12B', and 12C-12C' in FIG. 10.
Figure 13:
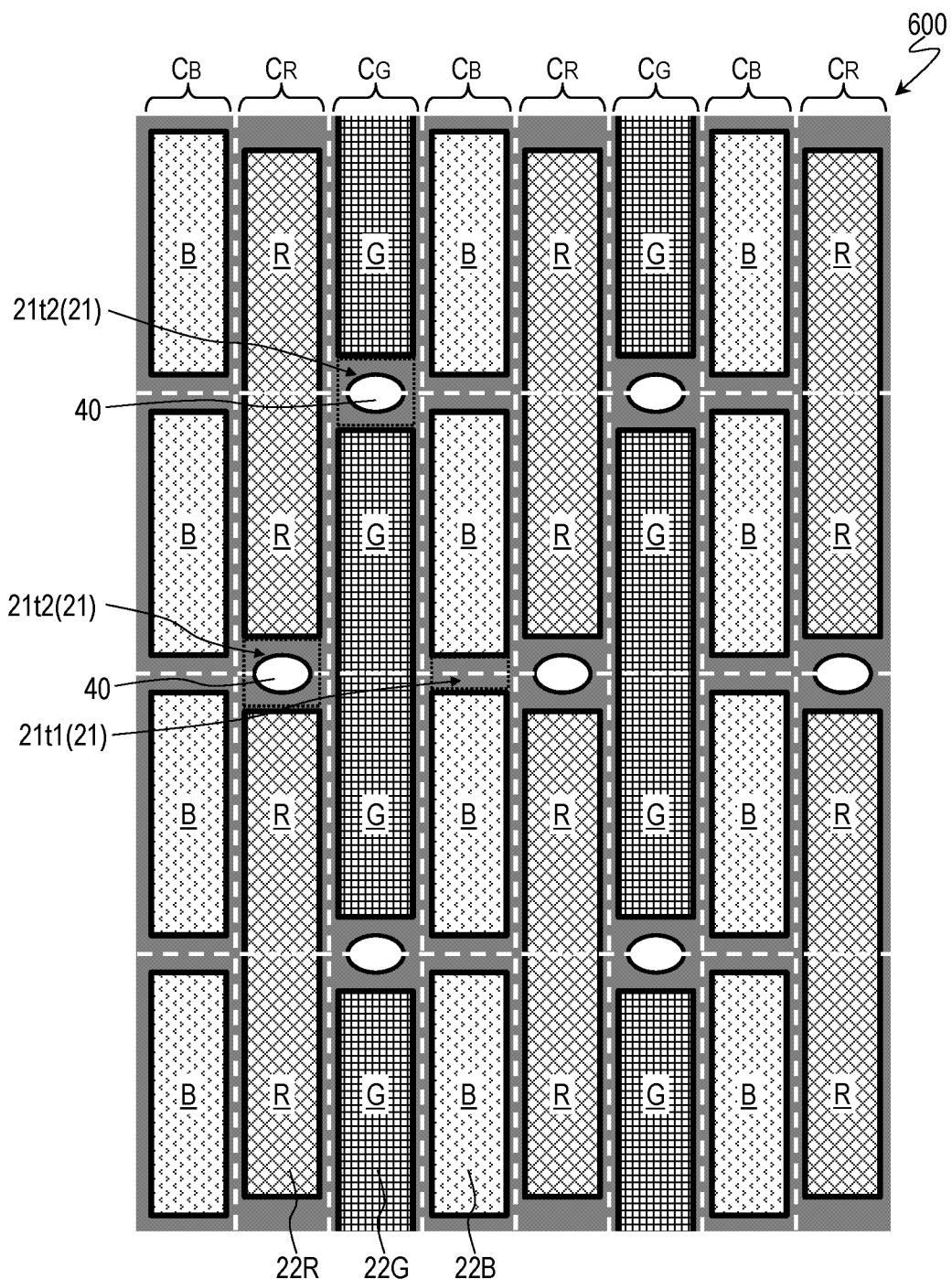
FIG. 13 is a schematic plan view illustrating the liquid crystal display device 600, in which a region corresponding to 32 (4 rows and 8 columns) pixels is illustrated.

FIGS. 10 to 13 illustrate a liquid crystal display device 600 according to this embodiment. FIG. 10 is a schematic plan view of the liquid crystal display device 600. FIG. 11 is a cross-sectional view taken along line 11A-11A' in FIG. 10. FIGS. 12(a), (b), and (c) are, respectively, cross-sectional views taken along lines 12A-12A', 12B-12B', and 12C-12C' in FIG. 10. FIG. 13 is a plan view illustrating the arrangement of the light-shielding layer 21, the red color filters 22R, the green color filters 22G, the blue color filters 22B, and the columnar spacers 40 in the liquid crystal display device 600; and a region corresponding to 32 pixels (4 rows and 8 columns) is illustrated.

In the liquid crystal display device 100 of Embodiment 1, the counter substrate 20 includes the color filter layer 22 and the light-shielding layer 21. In contrast, in the liquid crystal display device 600 of this embodiment, the TFT substrate 10 includes the color filter layer 22 and the light-shielding layer 21. In other words, a color filter-on-array structure is employed.

Specifically, the color filter layer 22 that includes the red color filters 22R, the green color filters 22G, and the blue color filters 22B, and the light-shielding layer 21 are formed on the organic insulating layer 17; and the auxiliary capacitor counter electrode 14, the dielectric layer 18, and the pixel electrodes 13 are formed on the color filter layer 22 in this order.

In the liquid crystal display device 600, the blue color filters 22B have an average transmittance greater than 0.2% for visible light having a wavelength of 450 nm or less, and each of the red color filters 22R and the green color filters 22G has an average transmittance of 0.2% or less for visible light having a wavelength of 450 nm or less. In other words, the red color filters 22R and the green color filters 22G are short-wavelength-light-absorbing color filters.

The light-shielding layer 21 of the liquid crystal display device 600 has one first TFT light-shielding portion 21t1 for each row in the blue pixel column $C_B$, and one second TFT light-shielding portion 21t2 every two rows in the red pixel column $C_R$ and the green pixel column $C_G$.

A second TFT light-shielding portion 21t2 in a particular red pixel column $C_R$ and a second TFT light-shielding portion 21t2 in a green pixel column $C_G$ adjacent to this red pixel column $C_R$ are not continuous in the row direction. In other words, the second TFT light-shielding portion 21t2 in the red pixel column $C_R$ and the second TFT light-shielding portion 21t2 in the green pixel column $C_G$ are shifted from each other by one row.

The columnar spacers 40 are arranged so that each does not overlap the first TFT light-shielding portion 21t1 but does overlap the second TFT light-shielding portion 21t2. In other words, the columnar spacers 40 are not disposed in the blue pixel column $C_B$ and are disposed only in the red pixel column $C_R$ and the green pixel column $C_G$. Moreover, the columnar spacers 40 include a columnar spacer 40 arranged to overlap the second TFT light-shielding portion 21t2 in the red pixel column $C_R$ and a columnar spacer 40 arranged to overlap the second TFT light-shielding portion 21t2 in the green pixel column $C_G$.

As described above, in the liquid crystal display device 600 according to this embodiment, the columnar spacers 40 are arranged so as not to overlap the first TFT light-shielding portions 21t1 in the blue pixel column $C_B$. Thus, the area of the first TFT light-shielding portion 21t1 may be relatively small, and thus the aperture ratios of the blue pixels B can be improved.

The area of the second TFT light-shielding portions 21t2 in the red pixel column $C_R$ and the green pixel column $C_G$ is larger than the area of the first TFT light-shielding portion 21t1; however, since the second TFT light-shielding portion 21t2 is provided every two rows, the aperture ratios of the red pixels R and the green pixels G can also be improved. Note that although there are TFTs 2 in the red pixel column $C_R$ and the green pixel column $C_G$ that are not shielded from light by the second TFT light-shielding portions 21t2, the average transmittance of the red color filters 22R and the green color filters 22G for visible light having a wavelength of 450 nm or less is 0.2% or less (in other words, the red color filters 22R and the green color filters 22G are short-wavelength-light-absorbing color filters); thus, deterioration of TFT characteristics (minus shift of threshold voltage) can be sufficiently suppressed. Thus, the reliability of the TFTs 2, which are oxide semiconductor TFTs, is not compromised.

In the liquid crystal display device 600, the TFT light-shielding portions 21t1 and 21t2 are provided in all of the red pixel columns $C_R$, the green pixel columns $C_G$, and blue pixel columns $C_B$; thus, aperture ratios of the red pixels R, the green pixels G, and the blue pixels B (plurality of pixels) can be easily made substantially the same among one another. Thus, even when a typical backlight is used, occurrence of chromaticity deviation can be suppressed.

In the liquid crystal display device 600 of this embodiment, as illustrated in FIG. 13, one columnar spacer 40 is provided for one color display pixel. As such, according to this embodiment, the columnar spacers 40 can be provided to all color display pixels without sacrificing the aperture ratio, and the flexibility of setting size, arrangement density, and layout of the columnar spacers 40 are enhanced. Moreover, the size and arrangement density of the columnar spacers 40 can be made different between the red pixel column $C_R$ and the green pixel column $C_G$; for example, the aperture ratio of the green pixels G can be made higher than the aperture ratio of other pixels (red pixels R and blue pixels B).

In the description above, a structure in which the arrangement of the TFTs 2 is the "portrait arrangement" is described as an example; alternatively, the arrangement of the TFTs 2 may be a "landscape arrangement". According to the "landscape arrangement", the channel width direction DW is parallel to the column direction (in other words, the channel length direction DL is parallel to the row direction), and the source region 2as, the channel region 2ac, and the drain region 2ad are lined along the row direction.

In the description above, the VA mode is described as an example of the display mode, but the display mode is not limited to the VA mode. For example, the display mode may be a horizontal field mode such as a fringe field switching (FFS) mode. In FFS mode, a structure in which pixel electrodes lie on the relatively upper side (upper layer) and a common electrode lies on the relatively lower side (lower layer) may be employed; alternatively, a structure in which a common electrode lies on the relatively upper side (upper layer) and pixel electrodes lie on the relatively lower side (lower layer) may be employed.

Depending on the usage of the liquid crystal display device, color filters in the pixel columns where the second TFT light-shielding portions 21t2 are provided (in other words, the pixel columns in which the columnar spacers 40 are provided) do not have to have an average transmittance of 0.2% or less for visible light having a wavelength of 450 nm or less. For example, in a liquid crystal display device for usage with which deterioration of the TFT characteristics due to short-wavelength light is rarely expected to occur, the color filters in the pixel columns where the second TFT light-shielding portions 21t2 are provided may have an average transmittance greater than 0.2% for visible light having a wavelength of 450 nm or less. From the viewpoint of suppressing deterioration of TFT characteristics, the color filters in the pixel column where the second TFT light-shielding portions 21t2 are provided preferably have an average transmittance of 1% or less for visible light having a wavelength of 450 nm or less, and more preferably have an average transmittance of 0.2% or less for visible light having a wavelength of 450 nm or less as with the short-wavelength-light-absorbing color filters described in the description of the present application.

INDUSTRIAL APPLICABILITY

According to the embodiments of the present invention, the aperture ratio of the liquid crystal display device equipped with oxide semiconductor TFTs can be improved while suppressing occurrence of chromaticity deviation. The embodiments of the present invention find wide usage in liquid crystal display devices equipped with oxide semiconductor TFTs and color filters.

REFERENCE SIGNS LIST 2 thin film transistor (TFT)
2a oxide semiconductor layer
2ac channel region
2as source region
2ad drain region
2g gate electrode
2s source electrode
2d drain electrode
10 TFT substrate (first substrate)
10a transparent substrate
11 scanning line
12 signal line
13 pixel electrode
13a pixel electrode slit
14 auxiliary capacitor counter electrode (common electrode)
14a region of common electrode where conductive film is removed
14b common electrode slit
15 gate insulating layer
16 inorganic insulating layer
17 organic insulating layer
18 dielectric layer
19 organic EL layer
20 counter substrate (second substrate)
20a transparent substrate
21 light-shielding layer (black matrix)
21s portion overlapping signal line in light-shielding layer
21t1 first TFT light-shielding portion
21t2 second TFT light-shielding portion
21t3 third TFT light-shielding portion
21t4 fourth TFT light-shielding portion
22 color filter layer
22R red color filter
22G green color filter
22B blue color filter
22Y yellow color filter
23 counter electrode
30 liquid crystal layer
40 columnar spacer
100, 100A, 200, 300 liquid crystal display device
400, 500, 600 liquid crystal display device
CH contact hole
R red pixel
G green pixel
B blue pixel
Y yellow pixel
DL channel length direction
DW channel width direction

The invention claimed is:

1. A liquid crystal display device comprising:
a first substrate,
a second substrate disposed to oppose the first substrate,
a liquid crystal layer disposed between the first substrate and the second substrate,
a plurality of pixels arranged into a matrix having a plurality of rows and a plurality of columns, and
a plurality of columnar spacers that are disposed between the first substrate and the second substrate and define a thickness of the liquid crystal layer, wherein
the plurality of pixels include red pixels that display red, green pixels that display green, and blue pixels that display blue,
an arrangement of the plurality of pixels is a stripe arrangement that includes a red pixel column, a green pixel column, and a blue pixel column,
the first substrate includes a thin-film transistor (TFT) that includes an oxide semiconductor layer including a channel region, a source region, and a drain region, each of the plurality of pixels being provided with one TFT,
the first substrate or the second substrate includes a color filter layer and a light-shielding layer,
the color filter layer includes a plurality of types of color filters that include a red color filter disposed in the red pixel column, a green color filter disposed in the green pixel column, and a blue color filter disposed in the blue pixel column,
the light-shielding layer includes a first TFT light-shielding portion that shields at least the channel region of the TFT from light in at least the blue pixel column, one first TFT light-shielding portion being provided for each row,
the light-shielding layer includes a second TFT light-shielding portion that shields at least the channel region of the TFT from light in a pixel column in which at least one type of color filter other than the blue color filter selected from among the plurality of types of color filters is provided, the second TFT light-shielding portion having a larger area than the first TFT light-shielding portion and being provided every n rows (n represents an integer of 2 or more), and the first TFT light-shielding portion is provided only in a first pixel column and the second TFT light-shielding portion is provided only in a second pixel column, and
the plurality of columnar spacers are arranged so that each does not overlap the first TFT light-shielding portion but does overlap the second TFT light-shielding portion.

2. The liquid crystal display device according to claim 1, wherein the at least one type of color filter is one type of color filter selected from among the plurality of types of color filters, and
the plurality of columnar spacers are arranged so that each overlaps the second TFT light-shielding portion in the pixel column in which the one type of color filter is provided.

3. The liquid crystal display device according to claim 2, wherein the one type of color filter is the red color filter, and
the plurality of columnar spacers are arranged so that each overlaps the second TFT light-shielding portion in the red pixel column.

4. The liquid crystal display device according to claim 2, wherein the one type of color filter is the green color filter, and
the plurality of columnar spacers are arranged so that each overlaps the second TFT light-shielding portion in the green pixel column.

5. The liquid crystal display device according to claim 1, wherein the at least one type of color filter includes two types of color filters selected from among the plurality of types of color filters.

6. The liquid crystal display device according to claim 5, wherein the second TFT light-shielding portion in a pixel column in which one type of color filter selected from the two types of color filters is provided, and the second TFT light-shielding portion in a pixel column in which the other type of color filter is provided are provided continuously so as to define a light-shielding region that extends two pixels in a row direction, and
the plurality of columnar spacers are arranged so that one columnar spacer is provided for each light-shielding region.

7. The liquid crystal display device according to claim 6, wherein the two types of color filters are the red color filter and the green color filter, and
the plurality of columnar spacers are arranged so that one columnar spacer is provided for each light-shielding region defined by the second TFT light-shielding portion in the red pixel column and the second TFT light-shielding portion in the green pixel column.

8. The liquid crystal display device according to claim 5, wherein the second TFT light-shielding portion in a pixel column in which one type of color filter selected from the two types of color filters is provided, and the second TFT light-shielding portion in a pixel column in which the other type of color filter is provided are not continuous in the row direction, and
the plurality of columnar spacers include a columnar spacer that is arranged to overlap the second TFT light-shielding portion in the pixel column in which the one type of color filter is provided, and a columnar spacer that is arranged to overlap the second TFT light-shielding portion in the pixel column in which the other type of color filter is provided.

9. The liquid crystal display device according to claim 8, wherein the two types of color filters are the red color filter and the green color filter, and
the plurality of columnar spacers include a columnar spacer that is arranged to overlap the second TFT light-shielding portion in the red pixel column, and a columnar spacer that is arranged to overlap the second TFT light-shielding portion in the green pixel column.

10. The liquid crystal display device according to claim 1, wherein the plurality of pixels further include yellow pixels that display yellow,
an arrangement of the plurality of pixels is a stripe arrangement that includes, in addition to the red pixel column, the green pixel column, and the blue pixel column, a yellow pixel column, and
the plurality of types of color filters further include a yellow color filter disposed in the yellow pixel column.

11. The liquid crystal display device according to claim 1, wherein the at least one type of color filter has an average transmittance of 0.2% or less for visible light having a wavelength of 450 nm or less.

12. The liquid crystal display device according to claim 1, wherein n =2.

13. The liquid crystal display device according to claim 1, wherein the plurality of pixels have aperture ratios substantially the same as each other.

14. The liquid crystal display device according to claim 1, wherein the second substrate includes the color filter layer and the light-shielding layer.

15. The liquid crystal display device according to claim 14, wherein the oxide semiconductor layer contains an In—Ga—Zn—O-based semiconductor.

16. The liquid crystal display device according to claim 15, wherein the In—Ga—Zn—O-based semiconductor contains a crystalline portion.

* * * * *